US008801971B2

(12) United States Patent
Nakako et al.

(10) Patent No.: US 8,801,971 B2
(45) Date of Patent: Aug. 12, 2014

(54) COPPER CONDUCTOR FILM AND MANUFACTURING METHOD THEREOF, CONDUCTIVE SUBSTRATE AND MANUFACTURING METHOD THEREOF, COPPER CONDUCTOR WIRING AND MANUFACTURING METHOD THEREOF, AND TREATMENT SOLUTION

(75) Inventors: Hideo Nakako, Tsukuba (JP); Kazunori Yamamoto, Tsukuba (JP); Yasushi Kumashiro, Tsukuba (JP); Youichi Machii, Tsuchiura (JP); Shunya Yokozawa, Tokyo (JP); Yoshinori Ejiri, Chikusei (JP); Katsuyuki Masuda, Yuki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 449 days.

(21) Appl. No.: 12/808,768

(22) PCT Filed: Dec. 17, 2008

(86) PCT No.: PCT/JP2008/073006
§ 371 (c)(1),
(2), (4) Date: Jun. 17, 2010

(87) PCT Pub. No.: WO2009/078448
PCT Pub. Date: Jun. 25, 2009

(65) Prior Publication Data
US 2012/0125659 A1  May 24, 2012

(30) Foreign Application Priority Data

Dec. 18, 2007 (JP) .................................. 2007-325863
Mar. 12, 2008 (JP) .................................. 2008-062964
Mar. 12, 2008 (JP) .................................. 2008-062966
Apr. 3, 2008 (JP) .................................. 2008-097349

(51) Int. Cl.
| | | |
|---|---|---|
| H01B 1/00 | (2006.01) | |
| H01B 1/12 | (2006.01) | |
| C22C 9/00 | (2006.01) | |
| C21B 11/10 | (2006.01) | |
| B05D 5/12 | (2006.01) | |
| B28B 19/00 | (2006.01) | |
| B29B 15/00 | (2006.01) | |
| C23C 18/00 | (2006.01) | |
| C23C 20/00 | (2006.01) | |
| C23C 24/00 | (2006.01) | |
| C23C 26/00 | (2006.01) | |
| C23C 28/00 | (2006.01) | |
| C23C 30/00 | (2006.01) | |
| H01C 17/06 | (2006.01) | |
| H05K 3/00 | (2006.01) | |
| B22F 3/00 | (2006.01) | |
| B22F 3/26 | (2006.01) | |
| B22F 5/00 | (2006.01) | |
| B22F 7/00 | (2006.01) | |
| C22C 28/00 | (2006.01) | |
| C22C 29/00 | (2006.01) | |
| B32B 15/20 | (2006.01) | |

(52) U.S. Cl.
USPC .......... 252/500; 427/98.4; 427/123; 420/469; 75/392; 428/546; 428/674

(58) Field of Classification Search
USPC .................. 252/500; 427/98.4, 123; 420/469; 75/392; 428/546, 674
See application file for complete search history.

(56) References Cited

U.S. PATENT DOCUMENTS

| | | |
|---|---|---|
| 2003/0001271 A1 | 1/2003 | Uozumi |
| 2007/0102678 A1* | 5/2007 | Kodas et al. .................. 252/500 |

FOREIGN PATENT DOCUMENTS

| | | |
|---|---|---|
| EP | 1 441 390 A2 | 7/2004 |
| JP | 61-279531 | 12/1986 |
| JP | 07-197266 | 8/1995 |

(Continued)

OTHER PUBLICATIONS

English translation of International Preliminary Report on Patentability dated Jul. 29, 2010.
Masanori Tomonari, Characteristic of a nano metal (Cu, Ag) particle and application to a conductive material, Technical Information Institute Co., Ltd.

(Continued)

Primary Examiner — Harold Pyon
Assistant Examiner — Tanisha Diggs
(74) Attorney, Agent, or Firm — Antonelli, Terry, Stout & Kraus, LLP.

(57) ABSTRACT

Provided are a copper conductor film and manufacturing method thereof, and patterned copper conductor wiring, which have superior conductivity and wiring pattern formation, and with which there is no decrease in insulation between circuits, even at narrow wiring widths and narrow inter-wiring spacing. Disclosed are a copper conductor film and manufacturing method thereof in which a copper-based particle-containing layer, which contains both a metal having catalytic activity toward a reducing agent and copper oxide, is treated using a treatment solution that contains a reagent that ionizes or complexes copper oxide and a reducing agent that reduces copper ions or copper complex to form metallic copper in a single solution, and patterned copper conductor wiring that is obtained by patterning a copper-based particle-containing layer using printing and by said patterned particle-containing layer being treated by a treatment method using a solution that contains both a reagent that ionizes or complexes copper oxide and a reducing agent that reduces copper ions or copper complexes to form metallic copper in a single solution.

7 Claims, 8 Drawing Sheets

(56) References Cited

FOREIGN PATENT DOCUMENTS

| | | | |
|---|---|---|---|
| JP | 07197266 | * | 8/1995 |
| JP | 2003-203522 | | 7/2003 |
| JP | 2004-225159 | | 8/2004 |
| JP | 2004-273205 | | 9/2004 |
| JP | 3599950 | | 9/2004 |
| JP | 2005-081501 | | 3/2005 |
| JP | 2005-272961 | | 10/2005 |
| JP | 2006-124814 | | 5/2006 |
| TW | 2007 02494 | | 1/2007 |

OTHER PUBLICATIONS

Office Action of Singapore Appln. No. 201004300-8 dated May 11, 2011 in English.
Taiwan Office Action dated Jun. 12, 2012 with English translation.
Chinese office action of Appln. 200880121523.4 dated Oct. 25, 2011 with English translation.

* cited by examiner

300°C
1.6 × 10⁻⁷ Ω·m

500°C
7.0 × 10⁻⁸ Ω·m

700°C
4.0 × 10⁻⁸ Ω·m

900°C
3.0 × 10⁻⁸ Ω·m (A)　　　　　　　(B)　　　　　　　(C)

(A)

(B)

(C)

(D)

(A)

(B)

(C)

(A)

(B)

(C)

(A)  (B)  (C)

(A)          (B)

(A)    (B)

COPPER CONDUCTOR FILM AND MANUFACTURING METHOD THEREOF, CONDUCTIVE SUBSTRATE AND MANUFACTURING METHOD THEREOF, COPPER CONDUCTOR WIRING AND MANUFACTURING METHOD THEREOF, AND TREATMENT SOLUTION

This is an application filed under 35 U.S.C. 371 of PCT/JP2008/073006, filed Dec. 17, 2008, which claims priority from Japan Application 2007-325863, filed Dec. 18, 2007, Japan Application 2008-062964, filed Mar. 12, 2008, Japan Application 2008-062966, filed Mar. 12, 2008 and Japan Application 2008-097349, filed Apr. 3, 2008.

1. Technical Field

The present invention relates to a copper conductor film and a manufacturing method thereof, a conductive substrate and a manufacturing method thereof, copper conductor wiring and a manufacturing method thereof, and a treatment solution.

2. Background Art

The formation of a wiring pattern by printing has been expected to be promising because of low energy, low costs, high throughput, on-demand production, and other superiorities. This purpose is achieved by following technique: an ink paste containing a metal element is used to form a pattern by printing, and then metallic conductivity is given to the printed wiring pattern.

Hitherto, for this purpose, a paste has been used wherein silver or copper in a flake form is incorporated, together with an organic solvent, a curing agent, a catalyst and the like, into a binder of a thermoplastic resin or thermosetting resin. The using method of this paste is conducted by painting the paste onto a target object with a dispenser or by screen printing, and then drying the resultant at room temperature or heating the resultant to about 150° C. to cure the binder resin, thereby forming a copper conductor film.

The volume resistance of the thus obtained copper conductor film, which depends on conditions for forming the film, ranges from $10^{-6}$ to $10^{-7}$ Ωm, and is a value 10-100 times the volume resistance of metallic silver or copper, which is $1.6 \times 10^{-8}$ Ωm or $1.7 \times 10^{-8}$ Ωm, respectively. The value is a value that is not equivalent at all to the conductivity of metallic silver or copper.

The reason why the conductivity of such a conventional copper conductor film made from silver/copper paste is low is that: in the copper conductor film obtained by the silver/copper paste, in order that only some parts of particles of the metals physically contact each other, the number of the contact points is small; contact resistance is generated in the contact points; and the binder remains between some parts of the particles so that the particles are hindered from contacting each other directly.

Moreover, in conventional silver pastes, silver particles are in the form of flakes having from 1 to 100 μm in particle diameter; therefore, it is in principle impossible to print wiring having a line width not more than the particle diameter of the flake-form silver particles.

Furthermore, an ink using particles having a particle diameter of 100 nm or less is desired in order to make wiring finer and apply the ink to an ink-jetting process. From these viewpoints, conventional paste is unsuitable for forming a fine wiring pattern.

As a method for overcoming these drawbacks of silver or copper paste, a method of forming a wiring pattern by using metal nanoparticles has been investigated, and methods using gold and silver nanoparticles have been established (see, for example, Patent Documents 1 and 2). Specifically, in a sintered body type wiring layer obtained by drawing a very fine circuit pattern by using a dispersion slurry containing gold or silver nanoparticles and then sintering the metal nanoparticles to be bonded to each other, it is possible to form wiring wherein the wiring line width and the space between the wiring lines are each from 5 to 50 μm, and the volume resistance is $1 \times 10^{-7}$ Ωm or less.

However, when using nanoparticles of a noble metal such as gold or silver, the unit price for producing a superfine-printing dispersion slurry thereof also increases since the material itself is expensive. This matter is a seriously large economic obstacle against the spread of the article as a versatile article into a wide range.

Furthermore, as the width of wiring lines and the space between the wiring lines become narrower, in the case of silver nanoparticles, a drawback that electromigration causes a fall in electric conductance between circuits becomes clearer as a problem.

For a metal nanoparticle dispersed slurry for the formation of fine wiring, it is expected to use copper, which is lower in electromigration, the unit price of the material itself being considerably lower compared to that of gold or silver. Particles of copper have a nature of being more easily oxidized than those of a noble metal. Thus, as a surface treating agent therefor, an agent having an anti-oxidizing effect besides a dispersibility improving effect is used. The agent used for such a purpose is a polymer having a substituent which interacts with a copper surface, or a treating agent having a long-chain alkyl group (for example, Patent Documents 3 and 4).

Hitherto, a method for making such copper particles having a surface treating agent has been consisted of the following three steps: the step (i) of eliminating protecting groups on the surface of copper particles, the step (ii) of reducing the surface oxide layer in a reducing atmosphere, and preventing the particles from being oxidized while the particles are sintered, and the step (iii) of bonding contact regions between the particles by melting. For the step (i) of the elimination of the protecting groups and the step (iii) of the melt-bonding, out of these steps, a large energy is required. Thus, it is essential to heat up to 200° C. or higher or to use an energy ray together. Thus, a substrate usable therein is restricted is a problem.

As illustrated in FIG. 1, a fusion state between the particles is largely varied in accordance with the temperature of the melt-bonding. The state has a great effect on physical properties of a sintered film of the copper conductor. FIG. 1 is views showing states that painted products of copper particles having an average particle diameter of 200 nm (trade name: MDL-201, manufactured by Ishihara Sangyo Kaisha, Ltd.) are sintered. The painted products are processed at 300° C. under a $N_2$ gas flow for 1 hour, and then sintered at individual temperatures under $N_2$ and $H_2$ gas flows ($N_2/H_2=97/3$). A method for the sintering is described in, for example, Non-Patent Document 1.

In general, according to a processing at a temperature of 300° C. or lower, not fusion between particles but necking, which only contact regions thereof are partially bonded, is mainly caused. Thus, a long electrical conduction path is generated so that the copper conductor film becomes high in resistance. Such a copper conductor film is poor in antioxidizability, breaking resistance and heat-shock, since it is porous, which is also problem.

Patent Document 1: JP-A-2004-273205
Patent Document 2: JP-A-2003-203522
Patent Document 3: Japanese Patent No. 3599950
Patent Document 4: JP-A-2005-081501

Non-Patent Document 1: Technical Information Institute Co., Ltd., Seminar "Ink-jetted Fine Wiring Forming Technique Using Copper Nanoparticle Ink Paste", page 27 of a material thereof.

DISCLOSURE OF THE INVENTION

Problems to be Solved by the Invention

In light of the above-mentioned problems in the prior art, the invention has been made. A target of the invention is to attain the following objects:

An object of the invention is to provide a copper conductor film that can be manufactured at a relatively low temperature, is excellent in conductivity and for wiring pattern formation, and does not cause a fall in electric conductance between circuits even when the wiring line width and the space between the wiring lines are narrow, and a manufacturing method thereof; and patterned copper conductor wiring.

Another object of the invention is to provide a manufacturing method of a conductive substrate that includes the step of treating a layer containing a copper oxide and the like by using a treatment solution which contains, in the single solution, a chemical agent capable of ionizing or complexing a copper oxide, and a reducing agent for reducing a copper ion (=a copper ion species) or a copper complex to be made into metallic copper, thereby precipitating copper, and that can give a conductive layer low in resistance and restrain copper from precipitating in regions other than a desired region; and a conductive substrate yielded by the manufacturing method.

Still another object of the invention is to provide a manufacturing method of a copper wiring substrate that includes the step of treating a wiring pattern made from a painting slurry which contains a copper oxide and the like by using a treatment solution which contains, in the single solution, a chemical agent capable of ionizing or complexing a copper oxide, and a reducing agent for reducing a copper ion or a copper complex to be made into metallic copper, thereby precipitating copper, and that can give conductive wiring low in resistance and restrain copper from precipitating in regions other than a desired region; and a copper wiring substrate yielded by the manufacturing method.

A further object of the invention is to provide a conductive substrate capable of making a copper conductor film thick and dense and further realizing a decrease in the resistance thereof; and a manufacturing method thereof.

A still further object of the invention is to provide copper conductor wiring dense and low in resistance; and a manufacturing method thereof.

An additional object of the invention is to provide a treatment solution with which a layer containing a copper oxide and the like is treated, whereby copper is precipitated so that the layer is made into a conductor.

Means for Solving the Problems

The inventors have acquired an idea that it is necessary for a solution of the above-mentioned problems to use a manner other than conducting heating at high temperature to shift parts of copper atoms into gaps between copper particles to a dense copper conductor film, and have made eager investigations. As a result, the inventors have found out a method of treating a metal particle deposit with a solution which contains both of a component (chemical agent) causing a metal oxide in a single solution to be dissolved as an ion or a complex, and a reducing agent for reducing a copper ion resulting from ionization or a copper complex made free in a complex form to be made into metallic copper, and then have made the invention.

In other words, means for solving the problems are as follows:

(1) A copper conductor film obtained by treating a copper based particle containing layer which contains both of a metal having catalytic activity onto a reducing agent and a copper oxide with a treatment solution which contains, in the single solution, a chemical agent for ionizing or complexing the copper oxide, and a reducing agent for reducing a copper ion or copper complex to be made into metallic copper.

In the present specification, the wording "copper based particles" means particles that are each a particle the whole of which is made of an oxide copper only, or a particle having a shell region including a copper oxide and a core region including a material other than copper oxide.

(2) The copper conductor film according to item (1), wherein the chemical agent for ionizing or complexing the copper oxide is at least one selected from the group consisting of basic nitrogen-containing compounds, salts of basic nitrogen-containing compounds, inorganic acids, salts of inorganic acids, organic acids, salts of organic acids, Lewis acids, dioximes, dithizone, hydroxyquinoline, EDTA, and β-diketones.

(3) The copper conductor film according to item (1) or (2), wherein the reducing agent for reducing a copper ion or copper complex is at least one selected from the group consisting of hydrogenated boron compounds, hydrogenated aluminum compounds, alkylamineborane, hydrazine compounds, aldehyde compounds, phosphorous acid compounds, hypophosphorous acid compounds, ascorbic acid, adipic acid, formic acid, alcohols, tin (II) compounds, metallic tin, and hydroxyamines.

(4) The copper conductor film according to any one of items (1) to (3), wherein the copper oxide contained in the copper based particle containing layer is cuprous oxide and/or cupric oxide.

(5) The copper conductor film according to any one of items (1) to (4), wherein the metal having catalyst activity onto the reducing agent is a transition metal in a metallic form or an alloy.

(6) The copper conductor film according to item (5), wherein the transition metal or the alloy is a metal selected from the group consisting of Cu, Pd, Ag, Ru, Rh, Ni, Pt and Au, or an alloy containing the metal.

(7) The copper conductor film according to any one of items (1) to (6), wherein the copper based particle containing layer contains, as the metal having catalyst activity onto the reducing agent and the copper oxide, particles having a core/shell structure having a core region including the metal and a shell region including the copper oxide.

(8) The copper conductor film according to any one of items (1) to (6), wherein the copper based particle containing layer is a layer wherein mixed particles in which the following are mixed at an arbitrary ratio are deposited: particles including the metal having catalyst activity onto the reducing agent as a component, and particles including the copper oxide as a component.

(9) The copper conductor film according to any one of items (1) to (6), wherein the copper based particle containing layer is a layer wherein mixed particles in which the following are mixed at an arbitrary ratio are deposited: particles including the metal having catalyst activity onto the reducing agent as a component; particles including the copper oxide as a component; and particles having a core/shell structure having a core region including the metal having catalyst activity onto the reducing agent and a shell region including the copper oxide.

(10) The copper conductor film according to any one of items (1) to (6), wherein the copper based particle containing layer is a layer obtained by laminating, onto a layer obtained by depositing particles including as a component the metal having catalyst activity onto the reducing agent, one or more layers containing particles including the copper oxide so as to contact the deposition-obtained layer.

(11) The copper conductor film according to any one of items (1) to (6), wherein the copper based particle containing layer is a layer obtained by laminating, onto a layer containing the metal having catalyst activity onto the reducing agent, one or more layers containing particles including the copper oxide.

(12) A manufacturing method of a copper conductor film, wherein a copper based particle containing layer which contains both of a metal having catalytic activity onto a reducing agent, and a copper oxide is treated with a treatment solution which contains, in the single solution, a chemical agent for ionizing or complexing the copper oxide, and a reducing agent for reducing a copper ion or copper complex to be made into metallic copper.

(13) Patterned copper conductor wiring, wherein a copper based particle containing layer containing both of a metal having catalytic activity onto a reducing agent, and a copper oxide is patterned by printing, the wiring being obtained by treating the patterned copper based particle containing layer in a treatment manner using a treatment solution which contains, in the single solution, a chemical agent for ionizing or complexing the copper oxide, and a reducing agent for reducing a copper ion or copper complex to be made into metallic copper.

(14) The patterned copper conductor wiring according to item (13), wherein the printing used to pattern the copper based particle containing layer is any one selected from the group consisting of ink-jetting, screen sprinting, transfer printing, offset printing, jet printing, a dispenser, a comma coater, a slit coater, a die coater, and a gravure coater.

(15) A manufacturing method of a conductive substrate, including:
the step of forming, on a substrate, a layer containing a metal having catalytic activity onto a reducing agent,
the step of forming, on the layer, copper particle layer containing particles having a core/shell structure having a core region including copper and a shell region including a copper oxide, and particles including the copper oxide, and
the step of treating the copper particle layer with a treatment solution which contains a chemical agent for ionizing or complexing the copper oxide, and a reducing agent for reducing a copper ion or copper complex to be made into metallic copper.

(16) The manufacturing method of a conductive substrate according to item (15), wherein about the particles (x) having the core/shell structure, and the particles (y) including the copper oxide, the ratio (x/y) by weight of the former to the latter is from 1/1 to 1/19.

(17) The manufacturing method of a conductive substrate according to item (15) or (16), wherein about the chemical agent (a) and the reducing agent (b) in the treatment solution, the mole ratio (a/b) of the former to the latter is less than 5000.

(18) The manufacturing method of a conductive substrate according to any one of items (15) to (17), wherein the chemical agent for ionizing or complexing the copper oxide is at least one selected from the group consisting of basic nitrogen-containing compounds, salts of basic nitrogen-containing compounds, inorganic acids, salts of inorganic acids, organic acids, salts of organic acids, Lewis acids, dioximes, dithizone, hydroxyquinoline, EDTA, and β-diketones.

(19) The manufacturing method of a conductive substrate according to any one of items (15) to (18), wherein the reducing agent for reducing a copper ion or copper complex is at least one selected from the group consisting of hydrogenated boron compounds, hydrogenated aluminum compounds, alkylamineborane, hydrazine compounds, aldehyde compounds, phosphorous acid compounds, hypophosphorous acid compounds, ascorbic acid, adipic acid, formic acid, alcohols, tin (II) compounds, metallic tin, and hydroxyamines.

(20) The manufacturing method of a conductive substrate according to any one of items (15) to (19), wherein the metal having catalyst activity onto the reducing agent is a transition metal in a metallic form or an alloy.

(21) The manufacturing method of a conductive substrate according to item (20), wherein at least one of the transition metal or the alloy is a metal selected from the group consisting of Cu, Pd, Ag, Ru, Rh, Ni, Pt and Au.

(22) A conductive substrate manufactured by a conductive substrate manufacturing method as recited in any one of items (15) to (21).

(23) A manufacturing method of copper conductor wiring, including:
the step of forming, on a substrate, a layer containing a metal having catalytic activity onto a reducing agent,
the step of drawing any wiring pattern using a painting slurry which contains particles having a core/shell structure having a core region including copper and a shell region including a copper oxide, and particles including the copper oxide on the layer, and the step of treating the drawn wiring pattern, which is made from the painting slurry, with a treatment solution which contains a chemical agent for ionizing or complexing the copper oxide, and a reducing agent for reducing a copper ion or copper complex to be made into metallic copper.

(24) Copper conductor wiring manufactured by a copper conductor wiring manufacturing method as recited in item (23).

(25) A manufacturing method of a conductive substrate, including:
the step of painting, onto a substrate, a painting slurry which contains particles having a core/shell structure having a core region including copper and a shell region including a copper oxide, thereby forming a painted film,
the step of subjecting the formed painted film to oxidizing treatment to decrease the distribution of the copper oxide component gradually from the outermost region of the painted film toward the substrate, and
the step of treating the painted film subjected to the oxidizing treatment with a treatment solution which contains a chemical agent for ionizing or complexing the copper oxide, and a reducing agent for reducing a copper ion or copper complex to be made into metallic copper.

(26) The manufacturing method of a conductive substrate according to item (25), wherein the oxidizing treatment is conducted by heating the painted film in the air.

(27) The manufacturing method of a conductive substrate according to item (25) or (26), wherein the chemical agent for ionizing or complexing the copper oxide is at least one selected from the group consisting of basic nitrogen-containing compounds, salts of basic nitrogen-containing compounds, inorganic acids, salts of inorganic acids, organic acids, salts of organic acids, Lewis acids, dioximes, dithizone, hydroxyquinoline, EDTA, and β-diketones.

(28) The manufacturing method of a conductive substrate according to any one of items (25) to (27), wherein the reducing agent for reducing a copper ion or copper complex is at least one selected from the group consisting of hydrogenated boron compounds, hydrogenated aluminum compounds, alkylamineborane, hydrazine compounds, aldehyde compounds, phosphorous acid compounds, hypophosphorous acid compounds, ascorbic acid, adipic acid, formic acid, alcohols, tin (II) compounds, metallic tin, and hydroxyamines.

(29) A conductive substrate manufactured by a conductive substrate manufacturing method as recited in any one of items (25) to (28).

(30) A manufacturing method of copper conductor wiring, including:

the step of drawing any wiring pattern using a painting slurry which contains particles having a core/shell structure having a core region including copper and a shell region including a copper oxide onto a substrate, the step of subjecting the drawn wiring pattern, which is made from the painted solution, to oxidizing treatment to decrease the distribution of the copper oxide component gradually from the outermost region of the wiring pattern toward the substrate, the step of treating the wiring pattern subjected to the oxidizing treatment with a treatment solution which contains a chemical agent for ionizing or complexing the copper oxide, and a reducing agent for reducing a copper ion or copper complex to be made into metallic copper, and the step of washing away the treatment solution.

(31) Copper conductor wiring manufactured by a copper conductor wiring manufacturing method as recited in item (30).

(32) A treatment solution for making a metal having catalytic activity onto a reducing agent, and a layer or laminate containing a copper oxide into a conductor, the treatment solution containing a chemical agent for ionizing or complexing the copper oxide, and a reducing agent for reducing a copper ion or copper complex to be made into metallic copper.

(33) The treatment solution according to item (32), wherein the chemical agent for ionizing or complexing the copper oxide is at least one selected from the group consisting of basic nitrogen-containing compounds, salts of basic nitrogen-containing compounds, inorganic acids, salts of inorganic acids, organic acids, salts of organic acids, Lewis acids, dioximes, dithizone, hydroxyquinoline, EDTA, and β-diketones.

(33) The treatment solution according to item (32) or (33), wherein the reducing agent for reducing a copper ion or copper complex is at least one selected from the group consisting of hydrogenated boron compounds, hydrogenated aluminum compounds, alkylamineborane, hydrazine compounds, aldehyde compounds, phosphorous acid compounds, hypophosphorous acid compounds, ascorbic acid, adipic acid, formic acid, alcohols, tin (II) compounds, metallic tin, and hydroxyamines.

Effects of the Invention

According to the invention, it is possible to provide a copper conductor film that can be manufactured at a relatively low temperature, is excellent in conductivity and for wiring pattern formation, and does not cause a fall in electric conductance between circuits even when the wiring line width and the space between the wiring lines are narrow, a manufacturing method thereof, and patterned copper conductor wiring.

According to the invention, it is also possible to provide a manufacturing method of a conductive substrate that includes the step of treating a layer containing a copper oxide and the like by using a treatment solution which contains, in the single solution, a chemical agent capable of ionizing or complexing a copper oxide, and a reducing agent for reducing a copper ion or a copper complex to be made into metallic copper, thereby precipitating copper, and that can give a conductive layer low in resistance and restrain copper from precipitating in regions other than a desired region, and a conductive substrate yielded by the manufacturing method.

Furthermore, according to the invention, it is possible to provide a manufacturing method of a copper wiring substrate that includes the step of treating a wiring pattern made from a painting slurry which contains a copper oxide and the like by using a treatment solution which contains, in the single solution, a chemical agent capable of ionizing or complexing a copper oxide, and a reducing agent for reducing a copper ion or a copper complex to be made into metallic copper, thereby precipitating copper, and that can give a conductive wiring low in resistance and restrain copper from precipitating in regions other than a desired region, and a copper wiring substrate yielded by the manufacturing method.

Furthermore, according to the invention, it is possible to provide a manufacturing method of a conductive substrate that is capable of making a copper conductor film thick and dense and further realizing a decrease in the resistance thereof.

Furthermore, according to the invention, it is possible to provide copper conductor wiring dense and low in resistance, and a manufacturing method thereof.

Furthermore, according to the invention, it is possible to provide a treatment solution with which a layer containing a copper oxide and the like is treated, whereby copper is precipitated so that the layer is made into a conductor.

DESCRIPTION OF REFERENCE NUMERAL 10 substrate

BEST MODE FOR CARRYING OUT THE INVENTION

<Copper Conductor Film and Manufacturing Method Thereof>

The copper conductor film according to the invention is a film obtained by treating a copper based particle containing layer which contains both of a metal having catalytic activity onto a reducing agent and a copper oxide with a treatment solution which contains, in the single solution, a chemical agent for ionizing or complexing the copper oxide, and a reducing agent for reducing a copper ion or copper complex to be made into metallic copper.

The manufacturing method of a copper conductor film according to the invention includes the step of treating a copper based particle containing layer which contains both of a metal having catalytic activity onto a reducing agent and a copper oxide with a treatment solution which contains, in the single solution, a chemical agent for ionizing or complexing the copper oxide, and a reducing agent for reducing a copper ion or copper complex to be made into metallic copper.

In the invention, the wording "copper conductor film" means a copper film made into a conductor.

Hereinafter, the copper conductor film according to the invention and the manufacturing method of a copper conductor film according to the invention will be described without dividing the two from each other.

Figure 1:
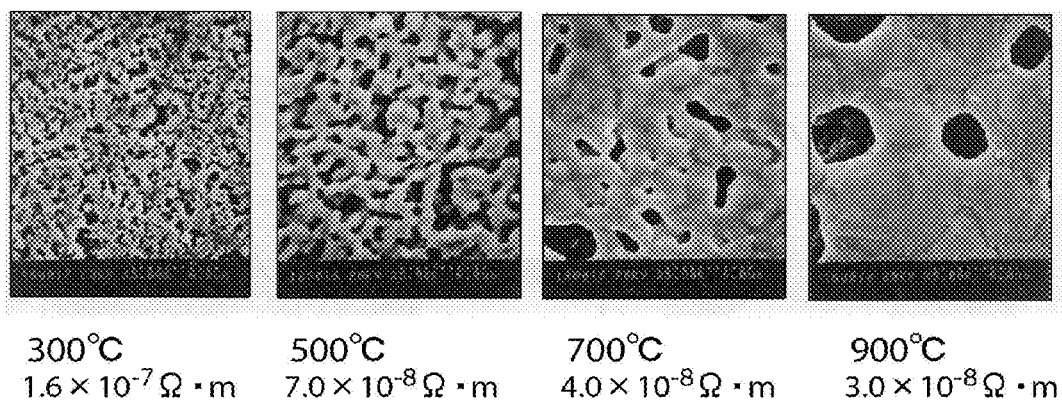
FIG. 1 is microscopic photographs showing states that painted products of copper particles having an average particle diameter of 200 nm (trade name: MDL-201, manufactured by Ishihara Sangyo Kaisha, Ltd.) are sintered.
Figure 2:
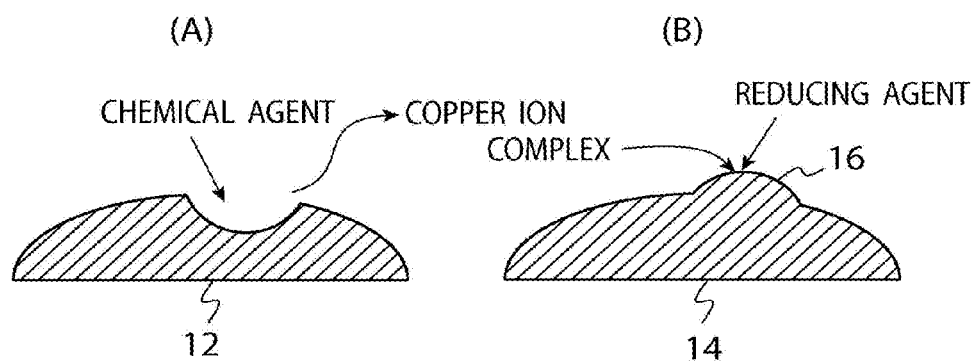
FIG. 2 are each a schematic view referred to in order to describe the elution of a copper oxide, and the reduction and precipitation of a metal ion.

The copper conductor film according to the invention is characterized in that the copper film is dense and low in resistance. First, a principle thereof is described. A process for manufacturing the copper conductor film according to the invention is shown in FIGS. 2(A) and 2(B). FIG. 2(A) shows a state that a copper oxide 12 is partially eluted with a chemical agent for ionization or complexing. FIG. 2(B) shows a state that a copper ion or copper complex obtained in the (A) reacts with a reducing agent on the surface of a metal 14 having catalytic activity so as to precipitate in the form of metallic copper 16. In other words, in the production, the process thereof advances roughly in accordance with the following two reactions (1) and (2): (1) A copper oxide in a single solution is made free in the form of a copper ion or copper complex in the solution by a chemical agent for ionization or complexing (FIG. 2(A)). (2) The free copper ion or copper complex is caused to react with a reducing agent on a metal surface having catalytic activity onto the reducing agent, to be precipitated in the form of metallic copper (FIG. 2(B)). According to this method, copper atoms are made free in the solution so that the atoms can be shifted over a relatively long distance. Copper originating from the copper oxide can be embedded into gaps between the particles although the possibility thereof depends on the ratio between the metal component and the copper oxide component. The thus-obtained copper film turns into a dense structure to exhibit a nature close to that of copper in the form of a bulk.

On the other hand, only copper atoms on particle surfaces that are in a high energy state on the basis of their surface energy are melted to be bonded to each other according to conventional sintering at 300° C. or lower. As a result, the particles are necked so that gaps between the particles remain as they are. Thus, there is a limit onto a decrease in the resistance.

If particle containing layer made only of a copper oxide is treated with the treatment solution according to the invention, the painted copper oxide is eluted or copper is precipitated into regions other than the painted region or into the solution. Thus, the layer is not effectively made into a conductor.

On the other hand, when a metal having catalytic activity onto a reducing agent is present in or near a copper based particle containing layer as in the invention, metallic copper is selectively precipitated onto the metal. Thus, only the patterned particle-deposited region can be selectively made into a conductor.

Hereinafter, each of the constituting elements of the copper conductor film according to the invention will be described.

[Copper Based Particle Containing Layer]

The copper based particle containing layer contains a metal having catalytic activity onto a reducing agent (hereinafter called a "catalytically active metal"), and a copper oxide.

(Copper Oxide)

The copper oxide component may be cuprous oxide and/or cupric oxide. The component reacts with the chemical agent in the treatment solution to supply a copper ion or copper complex into the solution.

In the invention, the copper oxide is classified into an embodiment wherein the copper oxide is used in the form of particles containing the copper oxide as a component (hereinafter called copper oxide particles), and an embodiment wherein the copper oxide is used in the form of particles wherein the surface of a catalytically active metal which will be described later is covered with the copper oxide, that is, particles having a core/shell structure containing a core region including a catalytically active metal and a shell region including the copper oxide (hereinafter called "core/shell particles"). First, the copper oxide particles will be described hereinafter.

—Copper Oxide Particles—

The copper oxide particles are each a spherical or bulk-form particle made of cuprous oxide, cupric oxide or a mixture thereof, and may be, for example, particles obtainable as a commercially available product, such as copper oxide nanoparticles manufactured by C.I. Kasei Co., Ltd., which are produced by a gas phase evaporation process, or copper oxide nanoparticles manufactured by Nisshin Engineering Inc., which are synthesized by a plasma flame process.

When the copper oxide are used in the form of particles in the invention, the primary average particle diameter is preferably from 1 to 10,000 nm, more preferably from 10 to 1,000 nm, and preferably from 10 to 500 nm from the viewpoint of the control of the reaction rate with the chemical agent in the treatment solution, such as ammonia.

(Catalytically Active Metal)

The catalytically active metal is preferably a transition metal in a metallic form, or an alloy. Specifically, at least one component of the transition metal or the alloy may be a metal selected from the group consisting of Cu, Pd, Ag, Ru, Rh, Ni, Pt and Au, or an alloy containing (one or more of) these metals. By a catalytic ability thereof onto a reducing agent, a copper ion or copper complex supplied from the copper oxide is reduced on the surface thereof, to be precipitated in the form of metallic copper.

In the invention, the catalytically active metal is classified into an embodiment wherein the metal is used in the form of particles, and an embodiment wherein the metal is used as forming a film. Details of each of the embodiments will be described later.

Figure 3:
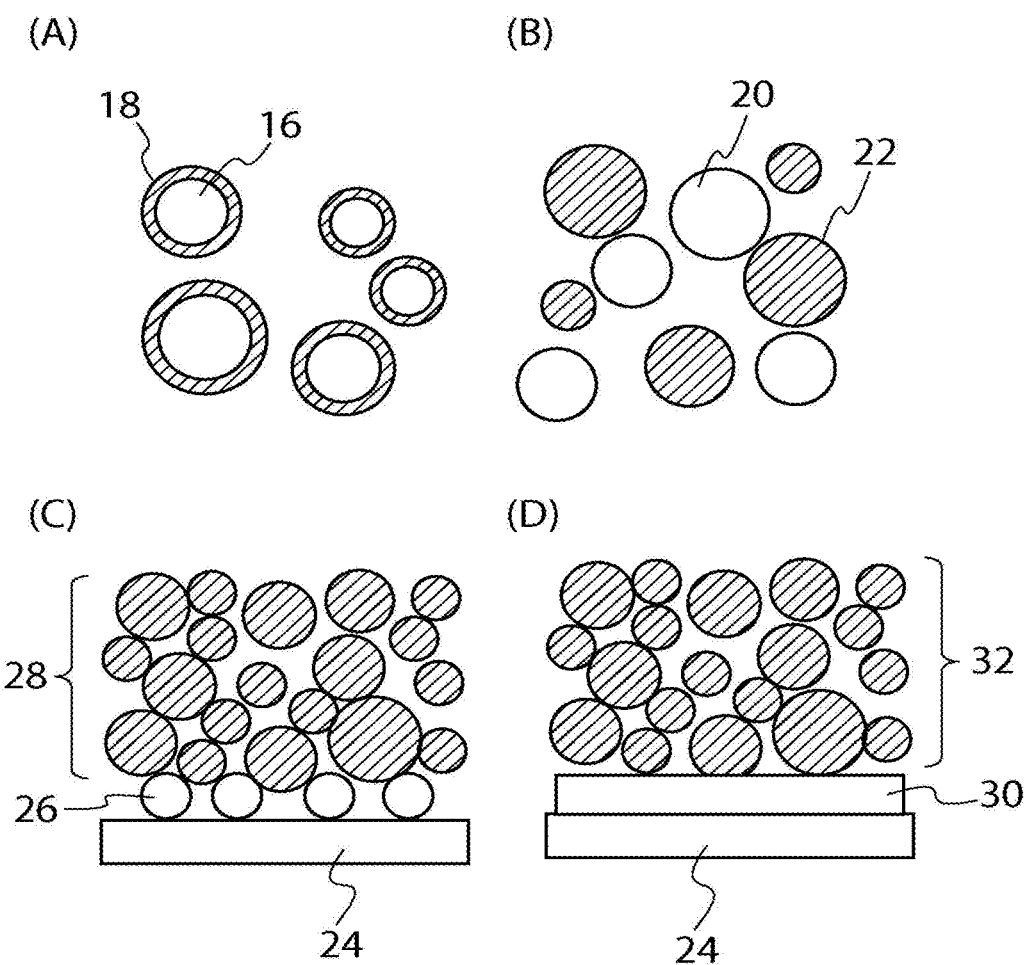
FIG. 3 are each a schematic view illustrating the structure of the metal oxide and the metal component.

In the copper based particle containing layer, the copper oxide component and the catalytically active metal component can be structured as illustrated in FIG. 3. The structures are specifically as follows:

(a) An embodiment wherein the catalytically active metal and the copper oxide are present in the state of particles having a core/shell structure containing a core region including the catalytically active metal and a shell region including the copper oxide, that is, an embodiment using particles wherein a copper oxide component 18 is present around each catalytically active metal component 16. More specifically, the following may be used: particles the surfaces of which are positively modified to cause the surfaces to have copper oxide shells; particles wherein a particle-multiplying technique is used to cause the vicinity of catalytically active metal particles to have the copper oxide; or particles each having an oxide coating produced by an unintended oxidation of the surface thereof.

(b) An embodiment wherein mixed particles in which the following are mixed at an arbitrary ratio are deposited into a layer: particles including the catalytically active metal as a component; and particles including the copper oxide as a component, that is, an embodiment wherein particles 20 including the catalytically active metal component are mixed with particles 22 including the copper oxide component to form a layer.

(c) An embodiment wherein one or more layers containing particles made of the copper oxide are deposited into a layer on a layer obtained by depositing particles including the catalytically active metal as a component, so as to contact the particle-deposited layer, that is, an embodiment wherein a particle layer 26 made of the catalytically active metal component is laid, as a single layer, on a substrate 24, and further a particle-deposited layer 28 made of the copper oxide component is laid on the particle layer 26.

(d) An embodiment wherein one or more layers containing particles made of the copper oxide are deposited on a layer containing the catalytically active metal, that is, an embodiment wherein a film 30 of a catalytically active metal component is laid on a substrate 24, and further a particle-deposited layer 32 made of the copper oxide component is laid on the film 30.

Furthermore, the copper based particle containing layer may have a structure wherein the embodiments (a), (b) and (c) are combined with each other. For example, it may be an embodiment wherein the embodiments (a) and (b) may be combined with each other (called "embodiment (e)"), that is, an embodiment wherein mixed particles in which the following are mixed at an arbitrary ratio are deposited into a layer: particles including the catalytically active metal as a component; particles including the copper oxide as a component; and particles having a core/shell structure having a core region including the catalytically active metal and a shell region including the copper oxide.

The following will describe a method for forming the copper based particle containing layer in each of the embodiments (a) to (e):

The copper based particle containing layer of the embodiment (a) can be formed by preparing a dispersion slurry containing core/shell particles obtained described below, painting the dispersion slurry, as a painting slurry, onto a substrate, and then drying the resultant.

—Core/Shell Particles—

The core/shell particles each having a core region including the catalytically active metal and a shell region including the copper oxide can be produced by compounding particles of the catalytically active metal with particles of the copper oxide, by precipitating the copper oxide onto particles of the catalytically active metal, by precipitating copper onto particles of the catalytically active metal and then oxidizing the copper layer, or by forming metallic copper particles and then oxidizing the surface thereof to form a shell of the copper oxide.

When the catalytically active metal of the core region is, in particular, copper, that is, the core region and the shell region each contain copper, the core/shell particles may be produced by irradiating a starting metal compound (copper compound) dispersed in an organic solvent exhibiting no reducing effect with a laser ray while stirring the solvent. The particles may also be produced by introducing a starting metal compound (copper compound) into plasma flame in an inert gas, and then cooling the compound with a cooling inert gas. Properties of the core/shell particles obtained by using the laser ray are controlled by the kind of the starting copper compound, the particle diameter of the starting copper compound, the amount of the starting copper compound, the kind of the organic solvent, the wavelength of the laser ray, the power output of the laser ray, the period for the irradiation with the laser ray, the temperature, the state that the copper compound is stirred, the kind of a bubbling gas introduced into the organic solvent, the amount of the bubbling gas, an additive and other conditions appropriately.

Details thereof will be described hereinafter.

A. Raw Material

The raw material is a copper compound, and specific examples thereof include copper oxide, copper (II) oxide, cuprous oxide, copper sulfide, copper octylate, and copper chloride.

The size of the raw material is important. Even when the raw material is irradiated with a laser ray having the same energy density, core/shell particles having a smaller particle diameter can be effectively obtained as the particle diameter of powder of the metal compound, as the raw material, is smaller. As the form thereof, raw materials having various forms may be used, examples thereof including a completely spherical form, a crushed form, a plate form, a scaly form, and a rod form.

B. Laser Ray

The wavelength of the laser ray is preferably a wavelength at which the absorption coefficient of the copper compound is made as large as possible. In order to restrain the crystal growth of fine copper particles of a nano-size, it is preferred to use a laser ray having a short wavelength, which produces, as a thermal ray, a small effect.

Examples of the laser ray include Nd:YAG laser, excimer laser, semiconductor laser, and colorant laser. In order to radiate a high-energy laser onto a large amount of the copper compound under the same conditions, it is preferred to radiate the laser in the form of pulses.

C. Organic Solvent (Dispersing Medium when Particles are Generated)

When nano-size particles are yielded, it is preferred to use a ketone solvent, such as acetone, methyl ethyl ketone, γ-butyrolactone or cyclohexanone, as the organic solvent used as a dispersing medium for the copper compound when the particles are produced therefrom. It is allowable to use a polar solvent, such as dimethylacetoamide, N-methylpyrrolidone or propylene glycol monoethyl ether, or a hydrocarbon solvent, such as toluene or tetradecane. One specie thereof may be used alone, or two or more thereof may be used in combination. When an organic solvent having reducing performance is used, an oxide coat that forms the shell of the copper particles is reduced so that the metal is made uncovered. In this way, aggregates are formed to damage the dispersion stability of the particles. Accordingly, it is preferred to use an organic solvent exhibiting no reducing effect.

The above-mentioned method for producing the core/shell particles is one example, and the invention is not limited thereto. When core/shell particles are commercially available, the particles may be used.

About the core/shell particles used in the invention, the number-average particle diameter of primary particles is preferably from 1 to 1,000 nm, more preferably from 1 to 500 nm, and even more preferably from 10 to 100 nm.

The dispersing medium used when the dispersion slurry containing the core/shell particles is prepared may be, for example, a ketone solvent, such as acetone, methyl ethyl ketone, γ-butyrolactone or cyclohexanone, a polar solvent, such as dimethylacetoamide, N-methylpyrrolidone or propylene glycol monoethyl ether, or a hydrocarbon solvent, such as toluene or tetradecane.

The dispersion may be conducted by using a medium disperser such as an ultrasonic disperser or a bead mill, a cavitation mixer such as a homomixer or a Silverson mixer, a counter-collision process such as an ULTIMIZER, an ultrathin-film high-speed rotary type disperser such as a CLEAR SS5, an autorotation and revolution type mixer, or some other machine.

The concentration of the core/shell particles in the dispersion slurry is restricted mainly by the viscosity and dispersibility that can be used in the method for painting or printing the slurry, and is preferably from 5 to 80% by weight, more preferably from 10 to 60% by weight, and even more preferably from 10 to 50% by weight.

The copper based particle containing layer of the embodiment (b) may be formed by preparing a dispersion slurry wherein particles including the catalytically active metal as a component, and particles including, as a component, the copper oxide are mixed at an arbitrary ratio, painting the dispersion slurry, as a painting slurry, onto a substrate, and then drying the resultant. The dispersing medium in the dispersion slurry is the same described about the embodiment (a).

The particles including the catalytically active metal as a component, mean particles containing, besides the catalytically active metal, a copper oxide, a metal having no catalytic performance, and an insulating material that is present in an amount not permitting the resistance of the final product to be raised and is not related to any reaction for the treatment for making the copper based particle containing layer into a conductor. The particles including the copper oxide as a component, mean particles containing, besides the copper oxide, a metal having no catalytic performance, and an insulating material that is present in an amount not permitting the resistance of the final product to be raised and is not related to any reaction for the treatment for making the copper based particle containing layer into a conductor.

The blend ratio of the particles (x) including the catalytically active metal as a component, to the particles (y) including the copper oxide as a component, (x:y) is preferably from 100:1 to 1:100000, more preferably from 10:1 to 1:100000, and even more preferably from 1:1 to 1:10000 in order to yield a copper conductor film dense and low in resistance.

When the catalytically active metal is used in the form of particles as in the present embodiment, it is more preferred that the surface area having catalytic activity is larger. Thus, the number-average primary particle diameter is preferably from 1 to 1000 nm, even more preferably from 1 to 100 nm.

In order to form the copper based particle containing layer of the embodiment (c), a layer wherein particles including the catalytically active metal as a component, are deposited is first formed. The method for forming this layer may be, for example, the painting, spraying or printing of a the metal particle dispersed slurry, acidic Pd seed treatment, alkali Pd seed treatment, or an electrostatic absorption of the metal particles.

When the metal particle dispersed slurry is painted to form the layer, the concentration of the catalytically active metal particles in the dispersion slurry is preferably from 0.01 to 50% by weight, more preferably from 0.05 to 10% by weight, and even more preferably from 0.1 to 5% by weight.

The dispersing medium in the dispersion slurry is the same as described about the embodiment (a). The number-average particle diameter of the particles including the catalytically active metal as a component is numerically the same as described in the embodiment (b). The layer thickness of the deposition layer is set preferably into the range of 1 to 500 nm (after the layer is dried).

Next, one or more deposition layer(s) obtained by painting a dispersion slurry wherein particles of the copper oxide are dispersed, as a painting slurry, and then drying the painted slurry are laminated onto the formed deposition layer made of the particles including the catalytically active metal as a component. For the formation of the two or more deposition layers, it is sufficient to repeat the painting and the drying of the painting slurry. It is preferred to laminate the deposition layer(s) in a number of 1 to 10.

The concentration of the copper oxide particles in the dispersion slurry is restricted mainly by the viscosity and dispersibility that can be used in the method for painting or printing the slurry, and is preferably from 5 to 80% by weight, more preferably from 10 to 60% by weight, and even more preferably from 10 to 50% by weight. The dispersing medium in the dispersion slurry is the same as described about the embodiment (a). The layer thickness of the deposition layer(s) is set preferably into the range of 0.1 to 100 μm (after dried).

In order to form the copper based particle containing layer of the embodiment (d), a layer containing the catalytically active metal is first formed. The method for forming the film may be the adhesion of metallic foil, vapor deposition, sputtering, the use of a metal substrate containing the catalytically active metal, CVD, metal plating, or a metallic powder painted and sintered film.

Next, one or more deposition layer(s) obtained by painting a dispersion slurry wherein particles of the copper oxide are dispersed, as a painting slurry, and then drying the painted slurry are laminated onto the formed catalytically active metal containing layer. For the formation of the two or more deposition layers, it is sufficient to repeat the painting and the drying of the painting slurry. It is preferred to laminate the deposition layer(s) in a number of Ito 10.

The dispersion slurry, wherein the copper oxide particles are dispersed, is the same as described about the embodiment (c).

The copper based particle containing layer of the embodiment (e) may be formed by preparing a dispersion slurry wherein the following are mixed at an arbitrary ratio, painting the dispersion slurry, as a painting slurry, onto a substrate, and then drying the resultant: particles including the catalytically active metal as a component; particles including the copper oxide as a component; and core/shell particles as described above. The dispersing medium in the dispersion slurry is the same described about the embodiment (a).

The blend ratio of the particles (x) including the catalytically active metal as a component, to the particles (y) including the copper oxide as a component (x:y) is preferably from 1:1 to 1:100000, more preferably from 1:1 to 1:100000, and even more preferably from 1:10 to 1:10000. The blend ratio of the particles (y) including the copper oxide as a component to the core/shell particles (z) (y:z) is preferably from 100:1 to 1:100, more preferably from 50:1 to 1:10, and even more preferably from 20:1 to 1:1.

The layer thickness of the copper based particle containing layer is preferably from 0.1 to 100 μm, more preferably from 0.1 to 80 min, and even more preferably from 0.1 to 50 μm in each of the embodiments.

[Substrate]

The copper conductor film according to the invention is preferably formed on a substrate. The material of the substrate may be specifically a film, sheet or plate made of polyimide, polyethylene naphthalate, polyether sulfone, polyethylene terephthalate, polyamideimide, polyetheretherketone, polycarbonate, liquid crystal polymer, epoxy resin, phenol resin, cyanate ester resin, fiber reinforced resin, inorganic particle filled resin, polyolefin, polyamide, polyphenylene sulfide, polypropylene, crosslinked polyvinyl resin, glass, ceramic material, or the like.

In the invention, the copper based particle containing layer can be sintered at a relatively low temperature; thus, little restriction is imposed on the substrate to be used because of a substrate low in heat resistance is usable or some other matter.

[Treatment Solution]

A treatment solution for treating the copper based particle containing layer formed as described above to be made into a conductor, that is, the treatment solution according to the invention is a solution which contains a chemical agent for ionizing or complexing a copper oxide component, and a reducing agent for reducing an eluted copper ion or copper complex to be precipitated into a metallic form, and which optionally contains a solvent wherein these can be dissolved. The treatment solution usually contains no copper ion.

Hereinafter, each of the components will be described in detail.

(Chemical Agent)

The chemical agent may be any agent that causes a copper oxide to be ionized or complexed to be dissolved, and is preferably at least one selected from the group consisting of basic nitrogen-containing compounds, salts of basic nitrogen-containing compounds, inorganic acids, salts of inorganic acids, organic acids, salts of organic acids, Lewis acids, dioximes, dithizone, hydroxyquinoline, EDTA, and β-diketones.

Of the above-mentioned chemical agents, basic nitrogen-containing compounds are preferred since many reducing agents become active in the basic side. Particularly preferred are amines and ammonia. More preferred are primary amines and ammonia since these have a high power for dissolving any copper oxide.

Other preferred examples of the basic nitrogen-containing compounds include tertiary amines such as ethylenediamine tetraacetates, triethanolamine, and triisopanolamine.

Examples of the organic acids and the organic acid salts include carboxylic acids and salts of carboxylic acids. Of these examples, preferred are polyhydric carboxylic acids, polyhydric carboxylic acid salts, aromatic carboxylic acids, salts of aromatic carboxylic acids, hydroxycarboxylic acids, and salts of hydroxycarboxylic acids. Specific preferred examples thereof include tartaric acid, phthalic acid, maleic acid, succinic acid, fumaric acid, salicylic acid, malic acid and citric acid; and salts thereof.

Examples of the dioximes include dimethylglyoxime, benzyldiglyoxime, and 1,2-cyclohexanedionediglyoxime. An example of the β-diketones is acetylacetone, and examples of aminoacetic acids include glycine, and other amino acids.

The concentration of the chemical agent for ionizing or complexing a copper oxide is preferably from 0.001 to 30 mol/L, more preferably from 0.01 to 15 mol/L, and even more preferably from 0.1 to 8 mol/L. If the concentration is less than 0.01 mol/L, the copper oxide may not be dissolved at a sufficient speed.

(Reducing Agent)

The reducing agent is preferably at least one selected from the group consisting of hydrogenated boron compounds, hydrogenated aluminum compounds, alkylamineborane, hydrazine compounds, aldehyde compounds, phosphorous acid compounds, hypophosphorous acid compounds, ascorbic acid, adipic acid, formic acid, alcohols, tin (II) compounds, metallic tin, and hydroxyamines, and is in particular preferably dimethylamineborane (DMAB), hydrazine, formaldehyde, ascorbic acid or the like; besides, citric acid or the like can also be preferably used.

The concentration of the reducing agent used in the treatment solution is preferably from 0.001 to 30 mol/L, more preferably from 0.01 to 15 mol/L, and even more preferably from 0.01 to 10 mol/L. If the reducing agent concentration is less than 0.001 mol/L, metallic copper may not be generated at a sufficient speed.

If the mole ratio between the concentration of the chemical agent for ionizing or complexing a copper oxide and that of the reducing agent is 5,000 or more, the concentration of the copper ion made free in the solution becomes high so that copper unfavorably precipitates in regions other than the particle deposited region.

The solvent is preferably a highly polar solvent since the solvent needs to dissolve therein the dissolving agent, the reducing agent, and a copper ion or copper complex. The solvent may be specifically water, glycerin, or formaldehyde.

The treatment in the invention advances at room temperature. The system may be heated or cooled in accordance with the necessity for accelerating or decelerating the reaction, or changing the state of the copper film to be produced. In order to control the evenness of the copper film, the reaction rate or bubbling in the reaction, the addition of an additive, stirring, the swing of the substrate, or the addition of ultrasonic waves may be conducted.

<Treatment with Treatment Solution>

In the invention, a copper based particle containing layer formed as described above is treated with the treatment solution. Specifically, for example, a substrate on which the copper based particle containing layer is formed is immersed in a container filled with the treatment solution, or the treatment solution is continuously sprayed onto the copper based particle containing layer. In any case, the copper oxide in the copper based particle containing layer is ionized or complexed with the chemical agent in the treatment solution.

Next, the resultant is reduced with the reducing agent so that metallic copper can be embedded in gaps between the particles. Thus, a dense copper conductor film can be formed.

The period for the treatment with the treatment solution may be appropriately set since the period is varied by the concentration or the temperature of the treatment solution. For example, the treatment period and the treatment temperature may be set into the range of 0.5 to 6 hours and room temperature to 90° C., respectively.

The substrate on which the copper conductor film is formed is exposed to extra pure water or the like, and then dried by/with wind drying, a hot plate, hot wind drying, an oven or the like. In order to make the drying easy, it is allowable to squirt acetone, methanol, ethanol or the like thereover to replace the water with the solvent, and then dry the film-formed substrate.

As described above, a copper conductor film can be manufactured.

<Patterned Copper Conductor Wiring> the patterned copper conductor wiring according to the invention is wiring wherein a copper based particle containing layer containing both of a metal having catalytic activity onto a reducing agent, and a copper oxide is patterned by printing, the wiring being obtained by treating the patterned copper based particle containing layer in a treatment manner using a treatment solution which contains, in the single solution, both of a chemical agent for ionizing or complexing the copper oxide, and a reducing agent for reducing a copper ion or copper complex to be made into metallic copper.

In other words, the patterned copper conductor wiring according to the invention is wiring obtained as follows: at the time of forming a copper based particle containing layer described about the copper conductor film according to the invention, a painting slurry for forming the copper based particle containing layer is printed into a wiring pattern form on a substrate, so as to form a layer which is to be a wiring pattern, and then the wiring pattern is treated with the above-mentioned treatment solution, thereby making the layer into a conductor.

The printing used to pattern the copper based particle containing layer is any two selected from the group consisting of ink-jetting, screen sprinting, transfer printing, offset printing, jet printing, a dispenser, a comma coater, a slit coater, a die coater, and a gravure coater.

In order to print the copper based particle containing layer to form a pattern in the invention, the number-average particle diameter of copper oxide particles and other individual particles used in a painting slurry (dispersion slurry) used to form the copper based particle containing layer is preferably 500 nm or less, considering that the wiring is made finer, or the application thereof onto each printing machine.

The concentration of the particles in the painting slurry is preferably from 1 to 70% by weight, more preferably from 10 to 60% by weight, and even more preferably from 10 to 50% by weight.

Specific examples of the material of the substrate used in the patterned copper conductor wiring according to the invention include polyimide, polyethylene naphthalate, polyethersulfone, polyethylene terephthalate, polyamideimide, polyetheretherketone, polycarbonate, liquid crystal polymer, epoxy resin, phenol resin, cyanate ester resin, fiber reinforced resin, polyolefin, polyamide, and polyphenylene sulfide.

Since the manufacturing method according to the invention does not have any step in which high temperature is required such as sintering, the substrate can be selected without considering heat resistance so much.

After the wiring pattern is drawn as described above, the pattern is treated in the same way as in the above-mentioned manufacturing method of a copper conductor film according to the invention. Specifically, the pattern is optionally dried, and then the formed wiring pattern is treated with the above-mentioned treatment solution. As a result, in the same manner as in the above-mentioned manufacturing method of a copper conductor film, metallic copper is precipitated in the copper based particle containing layer, to be made into a conductor. Additionally, metallic copper is precipitated also between the particles or the depths of the layer; thus, dense copper conductor wiring is yielded. In principle, therefore, the patterned copper conductor wiring according to the invention is wiring dense and low in resistance as well as the copper conductor film according to the invention being dense and low in resistance.

<Conductive Substrate and Manufacturing Method Thereof>

A first embodiment of the manufacturing method of a conductive substrate according to the invention includes the step of forming, on a substrate, a layer containing a metal having catalytic activity onto a reducing agent, the step of forming, on the layer, a copper particle layer containing particles having a core/shell structure having a core region including copper and a shell region including a copper oxide, and particles including the copper oxide, and the step of treating the copper particle layer with a treatment solution which contains a chemical agent for ionizing or complexing the copper oxide, and a reducing agent for reducing a copper ion or copper complex to be made into metallic copper.

The conductive-substrate-manufacturing method according to the present embodiment makes it possible to produce a conductive substrate having a conductive layer low in resistance while copper is restrained from precipitating in any region other than a desired region.

Each of the steps of the manufacturing method of a conductive substrate according to the invention (first embodiment) will be described below.

<Step of Forming, on a Substrate, a Layer Containing a Metal>

In the present step, a layer containing a metal having catalytic activity onto a reducing agent (hereinafter referred to as the "metal seeding layer") is formed on a substrate.

[Substrate]

A substrate usable (as the substrate) is the same as given in the description of the copper conductor film according to the invention. Similarly to the copper conductor film according to the invention, the manufacturing method according to the invention does not have any sintering step in which a temperature not lower than it is required. Thus, the substrate can be selected without considering heat resistance so much.

[Metal Having Catalytic Activity onto a Reducing Agent]

The metal having catalytic activity onto a reducing agent is the same as given in the description of the copper conductor film according to the invention.

The method for forming the metal seeding layer on the substrate is the same as described about the embodiment (c) in the description of the copper conductor film according to the invention.

<Step of Forming a Copper Particle Layer>

A copper particle layer is formed on the formed metal seeding layer. The copper particle layer contains particles having a core/shell structure having a core region including copper and a shell region including a copper oxide, and particles including the copper oxide.

Hereinafter, the copper/copper oxide core shell particles will be first described.

[Copper/Copper Oxide Core Shell Particles]

The particles having a core/shell structure having a core region including copper and a shell region including a copper oxide (hereinafter referred to as the copper/copper oxide core shell particles) are the same as a case where in the core/shell particles given in the description of the copper conductor film according to the invention, the core region includes copper. A preferred embodiment thereof is also equivalent thereto.

[Copper Oxide Particles]

The particles including the copper oxide (hereinafter referred to as the "copper oxide particles") are the same as given in the description of the copper conductor film according to the invention. A preferred embodiment thereof is also the same.

[Dispersing Medium]

The copper particle layer can be formed by preparing a dispersion slurry wherein the particles are dispersed into a dispersing medium, and then painting the dispersion slurry, as a painting slurry, onto a substrate or the like, thereby forming a painted film. Examples of the dispersing medium, which is used when the particle-containing dispersion slurry is prepared, include ketone solvents such as acetone, methyl ethyl ketone, γ-butyrolactone, and cyclohexanone; polar solvents such as dimethylacetoamide, N-methylpyrrolidone, and propylene glycol monoethyl ether; and hydrocarbon solvents such as toluene, and tetradecane.

The dispersion of the particles may be conducted by using a medium disperser such as an ultrasonic disperser or a bead mill, a cavitation mixer such as a homomixer or a Silverson mixer, a counter-collision process such as an ULTIMIZER, an ultrathin-film high-speed rotary type disperser such as CLEAR SS5, an autorotation and revolution type mixer, or some other machine.

The concentration of all the particles in the dispersion slurry is preferably from 1 to 70% by weight, more preferably from 5 to 60% by weight, and even more preferably from 10 to 50% by weight, from the viewpoint of an appropriate viscosity suitable for the printing or painting method of the dispersion slurry.

The ratio by weight of the copper/copper oxide core shell particles (x) to the copper oxide particles (y) (x/y) is preferably from 1/1 to 1/19, more preferably from 1/1 to 1/15, and even more preferably from 1/1 to 1/10 for balance between the supply of a copper ion from the copper oxide and the precipitation of copper onto the copper cores.

<Formation of the Copper Particle Layer>

The formation of the copper particle layer can be attained by painting, on the substrate surface, the dispersion slurry, which contains the copper/copper oxide core shell particles and the copper oxide particles, as a painting slurry, and then drying the resultant painted film. The painting of the painting slurry can be attained, using a bar coater, a comma coater, a die coater, a slit coater, a gravure coater or the like. The thickness of the painted film is preferably from 0.01 to 100 μm, more preferably from 0.1 to 50 μm, and even more preferably from 0.1 to 20 μm. The drying of the painted film can be attained, for example, by putting the film at 50 to 200° C. for 5 to 30 minutes on a hot plate, or in an oven, heating infrared rays, heating microwaves or the like. The film may be dried by any other well-known drying means. At this time, it is unnecessary to dry the film in an atmosphere from which oxygen is excluded as carried out for metallic copper particles since the surfaces of the copper/copper oxide core shell particles are made of the copper oxide.

<Treatment with a Treatment Solution>

Next, the formed copper particle layer is treated with a treatment solution, thereby precipitating metallic copper so as to make the copper particle layer into a conductor. The treatment solution is the same as given in the description of the copper conductor film according to the invention. A preferred embodiment thereof is also the same.

<Treatment with the Treatment Solution> the treatment solution is used to treat the copper particle layer in the same way as in the treatment with the treatment solution given in the description of the copper conductor film according to the invention.

In the invention, the copper particle layer is treated with the treatment solution, thereby precipitating metallic layer to make the layer into a conductor. At this time, the precipitation of copper is generated by using the metal particles seeded onto the substrate as nuclei; thus, copper precipitates in the depths of the copper particle layer, thereby a dense copper conductor film is obtained. The precipitation of copper is generated also from the cores of metallic copper incorporated into the copper particle layer, so that unreacted copper particles are fixed while surplus copper ions diffusing into the solution according to only the metal particle treatment of the substrate are precipitated from the upper of the copper cores, to be consumed. Therefore, metallic copper is precipitated only in the copper particle layer so that copper is not precipitated in any other region. Accordingly, a conductive substrate low in resistance can be manufactured without precipitating copper in any region other than a desired region.

<Conductive Substrate>

The conductive substrate according to the invention is manufactured by the manufacturing method of a conductive substrate according to the invention (first embodiment). Accordingly, dense copper is formed into the depths, and the resistance is low. Additionally, even when the substrate is made into a thick film, the substrate is in a state that the substrate is dense up to the depths thereof.

<Manufacturing Method of Copper Conductor Wiring>

The following will describe the manufacturing method of copper conductor wiring according to the invention.

A first embodiment of the manufacturing method of copper conductor wiring according to the invention includes the step of forming, on a substrate, a layer containing a metal having catalytic activity onto a reducing agent, the step of using a painting slurry which contains particles having a core/shell structure having a core region including copper and a shell region including a copper oxide, and particles including the copper oxide to draw a wiring pattern on the layer, and the step of treating the drawn wiring pattern, which is made from the painting slurry, with a treatment solution which contains a chemical agent for ionizing or complexing the copper oxide, and a reducing agent for reducing a copper ion or copper complex to be made into metallic copper.

The manufacturing method of copper conductor wiring according to the invention is different from the manufacturing method of a copper conductor film according to the invention (first embodiment) in that a painting slurry which contains copper/copper oxide core shell particles and particles including a copper oxide is used to draw a wiring pattern, and in a usable substrate. The two are substantially the same as each other in structures other than the above. Accordingly, only the different points will be described hereinafter.

[Painting Slurry]

The painting slurry, which contains copper/copper oxide core shell particles and copper oxide particles, can be obtained by dispersing these particles in a dispersing medium as described above. These particles are the same as the copper/copper oxide core shell particles and the copper oxide particles used in the manufacturing method of a conductive substrate according to the invention (first embodiment). However, the number-average particle diameter when the particles are dispersed is preferably set to 500 nm or less, considering that the wiring is made finer, or the application thereof onto each painting machine that will be described later.

The concentration of the particles in the painting slurry is preferably from 1 to 70% by weight, more preferably from 10 to 60% by weight, and even more preferably from 10 to 50% by weight. The blend ratio (ratio by weight) between the used copper/copper oxide core shell particles and the used copper oxide particles is the same as in the above-mentioned manufacturing method of a conductive substrate according to the invention (first embodiment).

Specific examples of the material of the substrate used in the manufacturing method of copper conductor wiring according to the invention (first embodiment) include polyimide, polyethylene naphthalate, polyethersulfone, polyethylene terephthalate, polyamideimide, polyetheretherketone, polycarbonate, liquid crystal polymer, epoxy resin, phenol resin, cyanate ester resin, fiber reinforced resin, polyolefin, polyamide, and polyphenylene sulfide.

Since the manufacturing method according to the invention does not have any step in which high temperature is required such as sintering, the substrate can be selected without considering heat resistance so much.

<Drawing a Wiring Pattern> the method of drawing a wiring pattern using the painting slurry on the substrate may be a painting or printing that has been hitherto used to paint an ink. In order to drawn the wiring pattern, it is allowable to use the painting slurry and use screen printing, jet printing, ink-jet printing, transfer printing, offset printing, or a disperser.

After the end of the drawing of the wiring pattern by using the painting slurry, the workpiece is dried at a temperature corresponding to the volatility of the dispersing medium. At this time, it is unnecessary to dry the workpiece in an atmosphere from which oxygen is excluded as carried out for metallic copper particles since the surface is made of the copper oxide.

The treatment after the wiring pattern is drawn as described above is the same as in the above-mentioned manufacturing method of a copper conductor film according to the invention (first embodiment). Specifically, the formed wiring pattern is optionally dried, and then treated with the above-mentioned treatment solution. As a result, in the same manner as in the above-mentioned (first embodiment) manufacturing method of a copper conductor film, metallic copper is precipitated on the copper particle layer, and the layer is made into a conductor. Additionally, metallic copper is precipitated in the depths of the copper particle layer; thus, dense copper conductor wiring is yielded.

<Copper Conductor Wiring>

According to a first embodiment of the copper conductor wiring of the invention is manufactured by the manufacturing method of copper conductor wiring according to the invention (first embodiment). Accordingly, each piece of the copper wiring is made of dense copper up to the center thereof. Thus, the wiring is low in resistance.

According to a second embodiment of the manufacturing method of a conductive substrate of the invention includes the step of painting, onto a substrate, a painting slurry which contains particles having a core/shell structure having a core region including copper and a shell region including a copper oxide, thereby forming a painted film, the step of subjecting the formed painted film to oxidizing treatment to decrease the distribution of the copper oxide component gradually from the outermost region of the painted film toward the substrate, and the step of treating the painted film subjected to the oxidizing treatment with a treatment solution which contains a chemical agent for ionizing or complexing the copper oxide, and a reducing agent for reducing a copper ion or copper complex to be made into metallic copper.

The manufacturing method of a conductive substrate according to the present embodiment makes it possible to make a copper conductor film thick and dense and further render the manufactured conductive substrate a conductive substrate capable of realizing a decrease in the resistance of the substrate.

The following will describe the constituting elements in the manufacturing method of a conductive substrate according to the invention (second embodiment).

[Copper/Copper Oxide Core Shell Particles]

The particles having a core/shell structure having a core region including copper and a shell region including a copper oxide (hereinafter referred to as the copper/copper oxide core shell particles) are the same as a case where in the core/shell particles given in the description of the copper conductor film according to the invention, the core region includes copper. A preferred embodiment thereof is also the same.

[Dispersing Medium]

In the manufacturing method of a conductive substrate according to the invention (second embodiment), a dispersion slurry is prepared wherein the particles are dispersed in a dispersing medium. The dispersion slurry is painted, as a painting slurry, onto a substrate or the like to form a painted film. The dispersing medium used at the time of preparing the dispersion slurry, wherein the particles are contained, may be the same as the dispersing medium given in the description of the manufacturing method of a conductive substrate according to the invention (first embodiment). The dispersing machine used in the dispersion and the concentration of the particles in the dispersion slurry are also the same as those in the first embodiment.

[Substrate]

The substrate used in the manufacturing method of a conductive substrate according to the invention (second embodiment) is the same as the substrate given in the description of the copper conductor film of the invention.

It is sufficient for the manufacturing method according to the invention (second embodiment) that the substrate is a substrate which can resist against heating at the time of oxidizing treatment which will be described later. Since the method does not have any step in which a temperature not lower than it is required such as sintering, the substrate can be selected without considering heat resistance so much.

[Treatment Solution]

The treatment solution, with which the painted film is treated, whereby the film is made into a conductor, is the same as given in the description of the copper conductor film according to the invention.

The following will successively describe steps in the manufacturing method of a conductive substrate according to the invention, and details of operation in each of the steps.

<Formation of the Painted Film>

The formation of the painted film can be attained by painting the dispersion slurry containing the copper/copper oxide core shell particles, as a painting slurry, onto a surface of the substrate, and then drying the resultant painted film. The painting of the painting slurry can be attained, using a bar coater, a comma coater, a die coater, a slit coater, a gravure coater or the like. The thickness of the painted film is preferably from 0.01 to 100 µm, more preferably from 0.1 to 50 min, and even more preferably from 1 to 10 µm. The drying of the painted film can be attained, for example, by putting the film at 20 to 300° C. for 1 to 30 minutes on a hot plate, or in an oven, heating infrared rays or the like. The film may be dried by any other well-known drying means. At this time, it is unnecessary to dry the film in an atmosphere from which oxygen is excluded as carried out for metallic copper particles since the surfaces of the copper/copper oxide core shell particles are made of the copper oxide.

<Oxidizing Treatment>

Next, the dried painted film is subjected to oxidizing treatment. The oxidizing treatment is conducted to decrease the distribution of the copper oxide component gradually from the outermost region of the painted film toward the substrate.

The method for the oxidizing treatment is, for example, a method of heating the film at a predetermined temperature in the air, a method of subjecting the film to ozone treatment, or a method of immersing the film into a solution containing an oxidizer. When the painted film is heated in the air, the oxidization of the film is started from the outermost region. As time elapses, the oxidization advances toward the depths (toward the substrate). However, in a case where the heating is stopped and then the film is cooled, or oxygen is blocked on the way, the advance of the oxidization is stopped at the time. Thus, the film can be turned into a state that only the vicinity of the outermost region is oxidized or the distribution of the copper oxide component is gradually decreased from the outermost region toward the substrate.

When the film is heated in the air, the temperature is preferably from room temperature to 800° C., more preferably from 60 to 300° C., and even more preferably from 100 to 250° C. The period for the heating is preferably from 1 to 1200 minutes, more preferably from 5 to 120 minutes and even more preferably from 5 to 60 minutes. However, the heating temperature and the heating period are varied in accordance with the primary particle diameter of the used particles, the scope of an oxidized region of the painted film, the thickness of the painted film, and the like. Thus, the temperature and the period may be appropriately set.

When the painted film is subjected to the oxidizing treatment by heating, the drying of the painted film can be simultaneously attained. Thus, it is unnecessary to set a drying step independently or separately.

(Treatment with the Treatment Solution)

After the oxidizing treatment, the painted film is treated with the above-mentioned treatment solution. Specifically, for example, the substrate on which the oxidization-treated painted film is formed is immersed into a container filled with the treatment solution, or the treatment solution is sprayed onto the painted film.

The period for the treatment with the treatment solution is varied in accordance with the treatment solution concentration or temperature. Thus, the period is appropriately set. The period may be set into the range of, for example, 0.1 to 24 hours. The temperature of the treatment solution is set preferably into the range of room temperature to 100° C.

Herein, the process from the step of subjecting the painted film to oxidization treatment to the step of the treatment with the treatment solution is described.

As described above, about the painted film containing the copper/copper oxide core shell particles in the invention, the outermost region thereof is partially subjected to oxidizing treatment. In this state, the copper oxide component is distributed in the largest amount in the outermost region of the painted layer and the component in the layer is present in a smaller amount toward the substrate. Specifically, in the outermost region than in the depths, copper/copper oxide core shell particles the shell regions (copper oxide) of which are thick are distributed in a larger amount. When such a painted film is treated with the treatment solution, the copper oxide is first ionized or complexed with the chemical agent in and the eluted in the treatment solution. However, in the depths of the painted film than in the outermost region thereof, the distribution of the particles the shell regions (copper oxide) of which are thick is smaller. Thus, in the copper/copper oxide core shell particles present in the depths, the cores of copper are earlier exposed to the outside.

In general, a process of reducing a copper ion to be returned to copper is advanced on a metallic surface by a catalytic effect of the surface. Thus, copper precipitates on the metallic surface. This process is hardly advanced on any region made only of a copper oxide, thus copper does not precipitate.

Accordingly, when the cores of metallic copper are made naked in the depths as described above, a copper ion and the like are selectively reduced on the copper core surfaces then the precipitation of copper advances. In other words, the precipitation of copper is started from the depths, and then the precipitation spreads to the whole. Therefore, a copper conductor film dense as a whole can be formed. Additionally, when the film is made thick, the treatment solution can permeate into the depths. Thus, the whole can be made dense.

The substrate on which the copper conductor film is formed is exposed to extra pure water or the like, and then dried by/with air drying, a hot plate, a hot wind drier, a thermostat, dried nitrogen gas flow, dried air flow, heating by infrared rays, heating by electromagnetic waves, or the like. In order to make the drying easy at this time, it is allowable to squirt acetone, methanol, ethanol, methyl ethyl ketone or the like thereover to replace the water with the solvent, and then dry the film-formed substrate.

As described above, a conductive substrate low in resistance can be manufactured.

<Conductive Substrate>

According to a second embodiment of the conductive substrate of the invention is manufactured by the manufacturing method of a conductive substrate according to the invention. Accordingly, the depths thereof are also made of dense copper. Thus, the substrate is low in resistance. Additionally, even when the substrate is made into a thick film, the substrate is in a state that the depths thereof are also dense. Moreover, the substrate is not easily oxidized in the air, or corroded with water or the like since the substrate is made of dense copper.

<Manufacturing Method of Copper Conductor Wiring>

Next, the manufacturing method of copper conductor wiring according to the invention will be described.

According to a second embodiment of the manufacturing method of copper conductor wiring of the invention includes the step of drawing a wiring pattern using a painting slurry which contains particles having a core/shell structure having a core region including copper and a shell region including a copper oxide onto a substrate, the step of subjecting the drawn wiring pattern, which is made from the painted solution, to oxidizing treatment to decrease the distribution of the copper oxide component gradually from the outermost region of the wiring pattern toward the substrate, and the step of treating the wiring pattern subjected to the oxidizing treatment with a treatment solution which contains a chemical agent for ionizing or complexing the copper oxide, and a reducing agent for reducing a copper ion or copper complex to be made into metallic copper.

The manufacturing method of copper conductor wiring according to the invention (second embodiment) is different from the manufacturing method of a conductive substrate according to the invention (second embodiment) in that a painting slurry containing copper/copper oxide core shell particles is used to drawn a wiring pattern, and in a usable substrate. The two are substantially the same as each other in essential requirements other than the above. Accordingly, only the different points will be described hereinafter.

[Painting Slurry]

The painting slurry containing copper/copper oxide core shell particles can be yielded by dispersing the particles into the above-mentioned dispersing medium. The particles are the same as the copper/copper oxide core shell particles used in the manufacturing method of a conductive substrate according to the invention. However, the number-average particle diameter of the particles is preferably 500 nm or less, considering that the wiring is made finer, or the application thereof onto each painting machine that will be described later.

The concentration of the particles in the painting slurry is preferably from 1 to 70% by weight, more preferably from 5 to 60% by weight, and even more preferably from 10 to 50% by weight.

The material of the substrate used in the manufacturing method of copper conductor wiring according to the invention is the same as that of the substrate given in the description of the manufacturing method of copper conductor wiring according to the invention.

<Drawing of a Wiring Pattern>

The method of drawing a wiring pattern using the painting slurry on the substrate is the same as the drawing method given in the description of the manufacturing method of copper conductor wiring according to the invention (first embodiment).

The treatment after the wiring pattern is drawn as described above is the same as in the above-mentioned manufacturing method of a conductive substrate according to the invention. Specifically, the workpiece is optionally dried, and then subjected to oxidizing treatment, and then the formed wiring pattern is treated with the above-mentioned treatment solution. As a result, in the same manner as in the above-mentioned manufacturing method of a conductive substrate, the copper oxide cores of the copper/copper oxide core shell particles in the depths of the wiring pattern are reduced so that metallic copper is made naked. From the metallic copper, the precipitation of copper is started, and then spreads to the whole thus dense copper conductor wiring is obtained.

<Copper Conductor Wiring>

The copper conductor wiring according to the invention is manufactured by the manufacturing method of copper conductor wiring according to the invention. Accordingly, the wiring is low in resistance since each copper wiring piece thereof is made of dense copper up to the central region thereof.

EXAMPLES

Hereinafter, the invention will be described by way of examples.

Example 1

As a substrate on which copper nanoparticles were deposited, the following was used: a substrate having a copper nanoparticle deposited layer (copper based particle containing layer) yielded by painting a 5% by mass dispersion slurry of copper nanoparticles (trial product, manufactured by Fukuda Metal Foil & Powder Co., Ltd.), produced in a solution by a laser ablation process, in γ-butyrolactone onto a polyimide substrate (trade name: MCF-5000I, manufactured by Hitachi Chemical Co., Ltd.) having copper patterns in FIG. 4 by means of an applicator, and then repeating the drying of the resultant at 100° C. under a nitrogen atmosphere 3 times.

It is understood from Auger electron spectroscopy and STEM-EDX observation that the present particles had a core/shell structure wherein a copper oxide layer was present around metallic copper.

Figure 5:
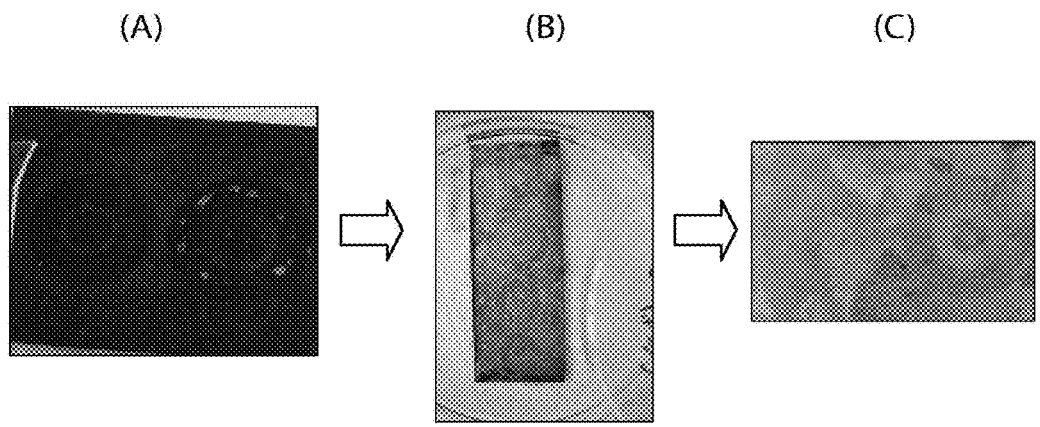
FIG. 5 are each a drawing substituted photograph referred to in order to describe the process of a reaction in Example 1.

A solution prepared by weighing in accordance with column 1 in Table 1 was used as a treatment solution. The substrate having the copper nanoparticle deposited film was put onto the bottom of a laboratory dish. The treatment solution was poured thereinto while a small piece of glass was put onto an end of the substrate to cause the substrate not to float. In this way, the film was treated to be made into a conductor (FIG. 5). FIG. 5(A) shows the copper nanoparticle painted substrate before any reaction, FIG. 5(B) shows a situation during a time when the film underwent reaction (after 1 hour), and FIG. 5(C) shows a situation after the reaction over five hours. As a result of the treatment at room temperature (20° C.), the copper nanoparticle deposited film that was black at first [FIG. 5(A)] was gradually turned into copper color [FIG. 5(B)] while the film generated foam. After the five hours, the film exhibited vivid copper gloss [FIG. 5(C)]. Although the figures are each monochromic, actual colors thereof were colors as described above.

As shown in FIG. 5, the coloration of the solution and the precipitation of copper into any region other than the copper oxide nanoparticle deposited region were not observed, only the particle deposited region was selectively turned to a metallic copper film (copper conductor film), different from that in Comparative Example 3. After the treatment over the five hours, the substrate was washed with pure water, and then dried in the air at room temperature.

Figure 4:
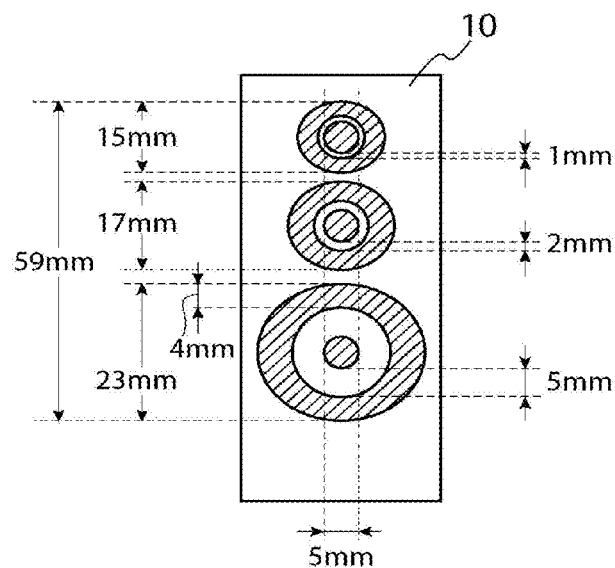
FIG. 4 is a schematic view illustrating a polyimide substrate having copper patterns.

Thereafter, a tester (CD800a, manufactured by Sanwa Electric Instrument Co., Ltd.) was used to measure the resistance between the central piece of each of the copper patterns in FIG. 4, which were each made of concentric pieces, and the outer circumferential piece thereof. In this way, the conduction of electricity was checked. As a result, in the concentrically-circular copper patterns having gaps of 1 mm, 2 mm and 5 mm, respectively, low resistances, which were 2.0Ω, 2.1Ω and 1.0Ω, respectively, were shown. This treated metallic copper film (copper conductor film) was trench-worked by FIB/SIMS. A cross section thereof was observed. As a result, the film thickness was 8 μmm. The volume resistances calculated by using this film thickness were $2.0 \times 10^{-5}$ Ωm, $2.1 \times 10^{-5}$ Ωm, and $1.1 \times 10^{-5}$ Ωm, respectively.

TABLE 1

| No. 1 | 1 | 2 | 3 | 4 |
|---|---|---|---|---|
| Complexing agent 1 | 28% Ammonia water | 28% Ammonia water | Ethylenediamine | n-Butylamine |
| Concentration (mol/L) | 1 | 1 | 1 | 1 |
| Blend amount (ml) | 27.37 | 27.37 | 6.01 | 14.63 |
| Complexing agent 2 | 2,2 Bipyridyl | | 2,2 Bipyridyl | 2,2 Bipyridyl |
| Concentration (mol/L) | 0.01 | None | 0.01 | 0.01 |
| Blend amount (ml) | 0.70 | | 0.16 | 0.31 |
| Complexing agent 3 | EDTA | | EDTA | EDTA |

TABLE 1-continued

| No. 1 | 1 | 2 | 3 | 4 |
|---|---|---|---|---|
| Concentration (mol/L) | 0.01 | None | 0.01 | 0.01 |
| Blend amount (ml) | 1.32 | | 0.29 | 0.59 |
| Reducing agent | Dimethyl-aminoborane | Dimethyl-aminoborane | Dimethyl-aminoborane | Dimethyl-aminoborane |
| Concentration (mol/L) | 0.1 | 0.1 | 0.1 | 0.1 |
| Blend amount (ml) | 2.65 | 2.65 | 0.59 | 1.18 |
| Solvent | Pure water | Pure water | Pure water | Pure water |
| Blend amount (ml) | 422.63 | 422.63 | 94.00 | 185.37 |
| Total amount (g) | 450 | 450 | 100 | 200 |

Example 2

In accordance with the blend table (column 2 in Table 1), a substrate as used in Example 1, which had a deposit film of the copper nanoparticles, was prepared. The substrate was treated with a treatment solution for conversion to a conductor (treatment solution) neither containing 2,2' bipyridyl nor EDTA in the same way as in Example 1. As a result, in the concentrically-circular copper patterns having gaps of 1 mm, 2 mm and 5 mm, respectively, resistances of 25 Ω, 28Ω and 238Ω were shown, respectively; thus, high electroconductivity was shown.

Example 3

In accordance with the blend table (column 3 in Table 1), a substrate as used in Example 1, which had a deposit film of the copper nanoparticles, was prepared. The substrate was treated with a treatment solution for conversion to a conductor (treatment solution) using ethylenediamine instead of ammonia in the same way as in Example 1. As a result, in the concentrically-circular copper patterns having gaps of 1 mm, 2 mm and 5 mm, respectively, resistances of 9.8 MΩ, ∞ and 131Ω were shown, respectively; thus, electroconductivity was shown.

Example 4

In accordance with the blend table (column 4 in Table 1), a substrate as used in Example 1, which had a deposit film of the copper nanoparticles, was prepared. The substrate was treated with a treatment solution for conversion to a conductor (treatment solution) using n-butylamine instead of ammonia in the same way as in Example 1. As a result, in the concentrically-circular copper patterns having gaps of 1 mm, 2 mm and 5 mm, respectively, resistances of 1.7 MΩ, 1.5 kΩ and ∞ were shown, respectively; thus, electroconductivity was shown.

Example 5

A dispersion slurry wherein copper nanoparticles as in Example 1 and copper oxide nanoparticles (Nano Tek CuO, manufactured by C.I. Kasei Co., Ltd.) were mixed at a ratio by weight of 1:1 was painted onto a substrate in the same way as in Example 1. The resultant was treated with a treatment solution for conversion to a conductor (treatment solution) prepared in accordance with the blend table (column 1 in Table 1).

In the concentrically-circular copper patterns having gaps of 1 mm, 2 mm and 5 mm, respectively, the resistances thereof were measured with a four-point probe microresistance meter (Loresta MCP-T610, manufactured by Mitsubishi Chemical Corp.). As a result, resistances of 0.17 Ω, 0.99Ω and 0.9Ω were shown, respectively; thus, high electroconductivity was shown.

Figure 6:
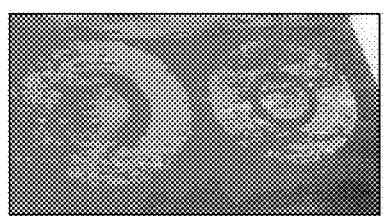
FIG. 6 are drawing substituted photographs showing external appearances of Examples 2 to 5, respectively, after reduction.
Figure 6:
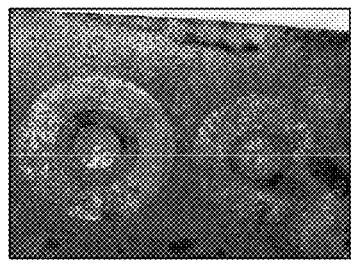
Figure 6:
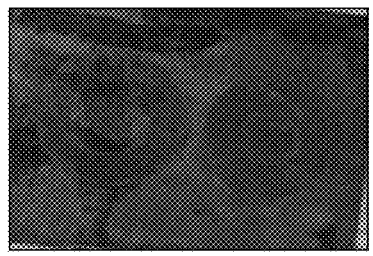
Figure 6:
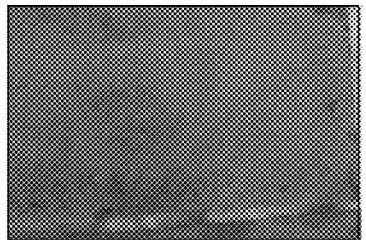

FIG. 6 show external appearances of Examples 2 to 5 after the reduction, respectively. FIGS. 6(A), 6(B), 6(C) and 6(D) show Examples 2, 3, 4 and 5, respectively.

Example 6

A 10% by mass dispersion slurry, which was prepared by suspending copper/copper oxide core shell particles (average particle diameter: 41 nm), manufactured by Nisshin Engineering Inc.) into γ-butyrolactone and then treating the suspension with an ultrasonic washer for 20 minutes, was painted onto a substrate and then dried in the same way as in Example 1. Thereafter, the same treatment as in Example 1 was conducted. As a result, in the concentrically-circular copper patterns having gaps of 1 mm, 2 mm and 5 mm, respectively, resistances of 0.9 Ω, 1.2Ω and 26Ω were shown, respectively; thus, high electroconductivity was shown.

Example 7

A 30% by mass dispersion slurry (CuIT, manufactured by ULVAC Materials, Inc.) of copper nanoparticles in toluene was painted onto a substrate in the same way as in Example 1, and then treated in the same way as in Example 1. As a result, in the concentrically-circular copper patterns having gaps of 1 mm, 2 mm and 5 mm, respectively, resistances of 5.2 kΩ, 107Ω and 11Ω were shown, respectively; thus, electroconductivity was shown.

Details of the copper conductor films of Examples 1 to 7 are shown in Table 2.

TABLE 2

| | Example 1 | Example 2 | Example 3 | Example 4 | Example 5 | Example 6 | Example 7 |
|---|---|---|---|---|---|---|---|
| Substrate | Polyimide substrate | Polyimide substrate | Polyimide substrate | Polyimide substrate | Polyimide substrate | Polyimide substrate | Polyimide substrate |
| Particles | Core/shell particles | Core/shell particles | Core/shell particles | Core/shell particles | Copper nanoparticles Copper oxide particles | Copper nanoparticles | Copper nanoparticles |
| Treatment solution | 1 | 2 | 3 | 4 | 1 | 1 | 1 |
| Resistance 1-mm Gap | 2.0 Ω | 25 Ω | 9.8 MΩ | 1.7 MΩ | 0.17 Ω | 0.9 Ω | 5.2 kΩ |

TABLE 2-continued

|  |  | Example 1 | Example 2 | Example 3 | Example 4 | Example 5 | Example 6 | Example 7 |
|---|---|---|---|---|---|---|---|---|
| values | 2-mm Gap | 2.1 Ω | 28 Ω | ∞ | 1.5 kΩ | 0.99 Ω | 1.2 Ω | 107 Ω |
|  | 5-mm Gap | 1.0 Ω | 238 Ω | 131 Ω | ∞ | 0.9 Ω | 26 Ω | 11 Ω |

Example 8

A substrate as used in Example 1 was immersed into an acidic palladium seed solution (trade name: PD301, manufactured by Hitachi Chemical Co., Ltd., and trade name: HS202B, manufactured by Hitachi Chemical Co., Ltd., the amounts of which were 250 g/L and 30 mL/L, respectively) at room temperature for 10 minutes, and then treated with a 1 M aqueous solution of sulfuric acid for 1 minute. The resultant was then dried at room temperature to yield a substrate Pd particles were seeded on its surfaces.

A 10% by mass dispersion slurry of copper oxide nanoparticles (Nano Tek CuO, manufactured by C.I. Kasei Co., Ltd.) in γ-butyrolactone was painted onto the substrate in the same way as in Example 1. The resultant was treated with a treatment solution for conversion to a conductor (treatment solution) prepared in accordance with the blend table (column 1 in Table 1) in the same way as in Example 1.

Figure 7:
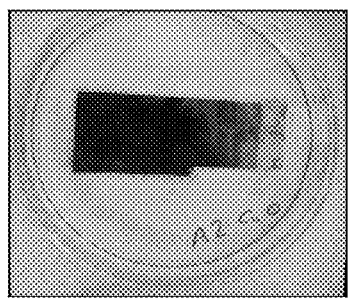
FIG. 7 are each a drawing substituted photograph showing a reducing treatment of a substrate wherein copper oxide particles were deposited on a Pd-seed-treated substrate.
Figure 7:
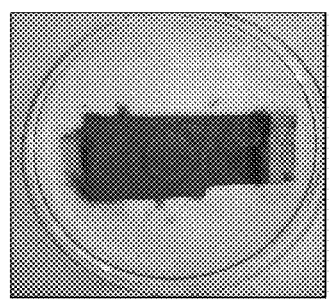
Figure 7:
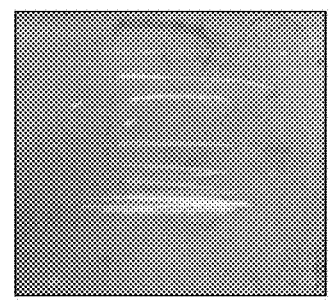

In FIG. 7 are shown situations of the substrate from a time during the treatment with the treatment solution to a time after the treatment. FIG. 7(A) shows the situation just after the start of the reaction, FIG. 7(B) shows the situation at the time of stopping the reaction, and FIG. 7(C) shows the situation that the surface was scratched with tweezers.

As shown in FIGS. 7(A) and 7(B), the coloration of the solution and the precipitation of copper into any region other than the copper oxide nanoparticle deposited region were not observed, different from that in Comparative Example 3. As a result of the treatment, the surface of the particle deposited region was dim and dull, copper color. However, when the surface was scratched with the sharp tweezers, or the like, copper gloss was observed and it was verified that the film was made of metallic copper up to the depths thereof [FIG. 7(C)].

In the concentrically-circular copper patterns having gaps of 2 mm and 5 mm, respectively, the resistances thereof were measured with a four-point probe microresistance meter (trade name: Loresta MCP-T610, manufactured by Mitsubishi Chemical Corp.). As a result, resistances of 0.035Ω, and 0.171Ω were shown, respectively. This treated particle-deposited film was trench-worked by FIB/SIMS. A cross section thereof was observed. As a result, the film thickness was 2 min. The volume resistances calculated by using this film thickness were $8.9 \times 10^{-8}$ Ωm, and $4.5 \times 10^{-7}$ Ωm, respectively; thus, high electroconductivity was exhibited.

Example 9

Figure 8:
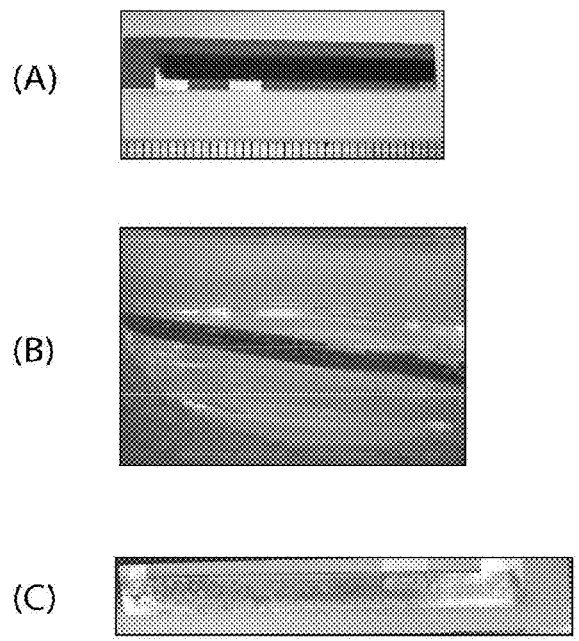
FIG. 8 are each a drawing substituted photograph showing a situation that a substrate on which ink-jet printed copper nanoparticles were deposited was treated.

An ink-jet printer was used to ink-jet-print a 12% by mass dispersion slurry of copper nanoparticles as used in Example 1, thereby yielding a sample wherein a copper nanoparticle painted film was patterned into a rectangular form. FIG. 8(A) shows an external appearance of the ink-jet-printed copper nanoparticles. This copper particle painted substrate produced by the ink-jet printing process was treated in the same way as in Example 1 for 3 hour. As a result, the particle painted matter, which was black before the treatment, was turned into copper color. FIG. 8(B) shows a situation thereof at a time (after 10 minutes) during a period when the film underwent reaction, and FIG. 8(C) shows a situation thereof after the end of the reaction.

In the treated particle painted substrate, the resistance between two of its copper foil electrodes were each measured with a tester (trade name: CD800a, manufactured by Sanwa Electric Instrument Co., Ltd.). As a result, the resistance of the electrodes having an interval of 5 mm and that of 20 mm were 12 MΩ and 28 MΩ, respectively. When the resistances were measured before the reduction, the above-mentioned inter-electrode resistances were each not less than the measurement limit. In short, electric conduction was not observed. Although the figures are each monochromic, actual colors thereof were colors as described above.

Comparative Example 1

Figure 9:
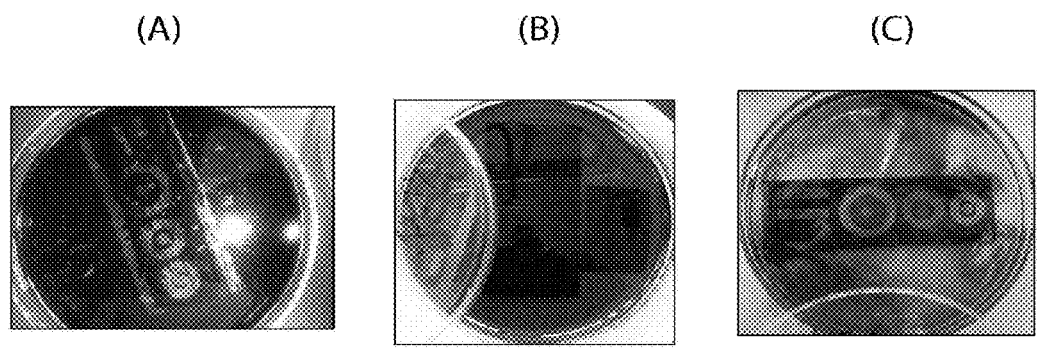
FIG. 9 are drawing substituted photographs showing external appearances of Comparative Examples 1 to 3, respectively, after reduction.

A substrate as in Example 1, which had a copper nanoparticle deposited film, was treated with an aqueous solution containing only dimethylaminoborane (0.1 mol/L), which did not contain any amine component. During the treatment, the solution was colored into brown, different from that in Example 1, wherein the treatment advanced in the state that the solution was kept transparent. The situation is shown in FIG. 9(A). As a result, in all the patterns, wherein their concentric pieces had gaps of 1 mm, 2 mm, and 5 mm, respectively, electric conduction was not observed.

Comparative Example 2

A substrate as in Example 1, which had a copper nanoparticle deposited film, was treated with an aqueous solution which was composed of ammonia, bipyridyl and EDTA and not contained dimethylaminoborane as a reducing agent. During the treatment, the solution was colored into blue, different from that in Example 1, wherein the treatment advanced in the state that the solution was kept transparent. The copper oxide was eluted into the solution as a copper ammine complex. The colored situation is shown in FIG. 9(B). As a result of the treatment, the treated substrate was kept black without undergoing any change. In all the patterns, wherein their concentric pieces had gaps of 1 mm, 2 mm, and 5 mm, respectively, electric conduction was not observed.

Comparative Example 3

A 10% by mass dispersion slurry of copper oxide nanoparticles (Nano Tek CuO, manufactured by C.I. Kasei Co., Ltd.) in γ-butyrolactone was painted onto a substrate in the same way as in Example 1. The resultant was treated with a treatment solution for conversion to a conductor (treatment solution) prepared in accordance with the blend table (column 1 in Table 1). As a result of the treatment, most of the copper oxide particles painted onto the treated substrate were eluted and lost, and copper precipitated on the copper patterns or walls of the glass vessel. The situation is shown in FIG. 9(C). In all the patterns, wherein their concentric pieces had gaps of 1 mm, 2 mm, and 5 mm, respectively, electric conduction was not observed.

Comparative Example 4

A substrate as yielded in Example 1, which had a copper nanoparticle deposited film (copper based particle containing layer), was used. The substrate was subjected to heating treatment at 200° C. under 1 atmospheric pressure of hydrogen for 1 hour instead of the treatment with any treatment solution, so as to make an attempt for making the film into a conductor. As a result, in the patterns wherein their concentric pieces had gaps of 1 mm and 2 mm, respectively, electric conduction was not observed.

Comparative Example 5

A substrate as yielded in Example 5, which had a copper nanoparticle deposited film (copper based particle containing layer), was used. The substrate was treated in the same way as in Example 4. As a result, in the concentrically-circular copper pattern having a gap of 1 mm, the resistances were $2.3 \times 10^7 \Omega$ while in that having a gap of 2 mm, electric conduction was not observed.

As shown in Table 1, in Examples 1 to 7, in each of which a chemical agent for ionizing or complexing a copper oxide, and a reducing agent were contained in a treatment solution, the copper oxide was finally reduced into copper, and an effect of embedding the copper into gaps between the copper particles was obtained. Thus, a low resistance was shown. However, in Comparative Example 1, a reducing agent was contained but no chemical agent was contained, and Comparative Example 2, a chemical agent was contained but no reducing agent was contained, each of which no effect based on the missing component was produced, and the final step did not reach up to the generation of metallic copper.

In each of Examples 1 to 7, a catalytically active metal was used, and the precipitation of reduced copper was caused selectively around the catalytically active metal. Thus, the precipitation of copper was observed only in the painted layer. On the other hand, in Comparative Example 3, no catalytically active metal was used; thus, most of the painted layer containing the copper oxide was eluted out, and further the precipitation of copper into a region other than the painted layer was observed.

Comparative Examples 4 and 5, wherein the attempt for making a copper based particle containing layer into a conductor was made, a high resistance was observed, or no electric conduction was observed. In other words, the comparative examples had a problem about electroconductivity.

Example 10

Steps from the Formation of a Pd Seed Seeded Substrate to the Formation of a Copper Particle Layer An epoxy substrate (MCL-679FB, manufactured by Hitachi Chemical Co., Ltd.) 10 having copper foil (FOWS, manufactured by Furukawa Electric Co., Ltd.) patterns (hatched regions illustrated in FIG. 4) was first immersed in an acidic palladium seed solution (aqueous solution of HS202B (manufactured by Hitachi Chemical Co., Ltd.) and PD301 (manufactured by Hitachi Chemical Co., Ltd.)) at 25° C. for 5 minutes. Thereafter, the substrate 10 was immersed in an aqueous solution of a treatment agent for adhesion promotion (ADP601, manufactured by Hitachi Chemical Co., Ltd.) for 5 minutes to seed Pd particles onto the substrate (metal seeded layer). Copper/copper oxide core shell particles (manufactured by Nisshin Engineering Inc.; number-average particle diameter: 41 nm) and copper oxide nanoparticles (manufactured by C.I. Kasei Co., Ltd.; number-average particle diameter: 50 nm) were mixed at a ratio by weight of 1:9, and the mixture was added to γ-butyrolactone to give a concentration of 20% by weight. The resultant was treated with an ultrasonic washer to disperse the particles. In this way, a dispersion slurry was yielded. A bar coater was used to paint this dispersion slurry onto the substrate, and then the painted film was dried on a hot plate at 100° C. under a nitrogen gas flow for 10 minutes to form a substrate having a copper particle deposited film.

(Formation of a Copper Particle Layer)

Figure 10:
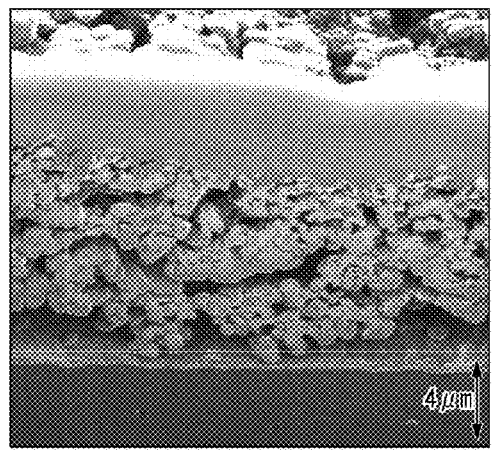
FIG. 10 is a drawing substituted photograph showing an SIM image of an FIB-worked cross section of a copper particle layer in Example 10.

Next, the individual components described in column 1 in Table 1 were weighed, and mixed with each other to yield a treatment solution A. The mole ratio of the chemical agent (a) to the reducing agent (b) (a/b) in this treatment solution A was 10.2. The substrate having the copper nanoparticle deposited film was put onto the bottom of a laboratory dish. While a small piece of glass was put onto an end of the substrate to cause the substrate not to float, the treatment solution A was poured thereinto so as to conduct a treatment (reaction) for 5 hours. As a result, without precipitating copper onto walls of the container or the like, the treatment advanced while only the copper based particle painted region was selectively discolored. By this treatment, the copper particle layer was discolored into dull copper color. After the end of the treatment, the resultant was immersed into extra pure water to be washed therewith. Thereafter, the resultant was dried in the air. About the electrodes having gaps of 1 mm and 5 mm, respectively, in FIG. 4, the resistances therebetween were each measured with a four-point probe microresistance meter (Loresta MCP-T610, manufactured by Mitsubishi Chemical Corp.). Using the film thickness obtained by FIB/SIM cross-section observation, which was 9.3 μm, the volume resistances were calculated. The resistances were $2.3 \times 10^{-7}$ Ωm, and $1.0 \times 10^{-6}$ Ωm, respectively. As shown in FIG. 10, according to the FIB/SIM cross-section observation, no structure made of the copper nanoparticles, which were a raw material, came to be seen, and a structure of copper in the order of micrometers was generated.

Comparative Example 6

A dispersion slurry yielded by adding copper/copper oxide core shell particles (manufactured by Nisshin Engineering Inc.; number-average particle diameter: 41 nm) to γ-butyrolactone to give a concentration of 20% by weight was painted onto a Pd-seeded epoxy substrate as in Example 10 with a bar coater. The resultant was dried on a hot plate at 100° C. under a nitrogen gas flow for 10 minutes to form a substrate having a copper particle layer. Next, the substrate was treated in the same way as in Example 10. The treatment advanced while only the copper based particle painted region was selectively discolored into copper color. Moreover, during the treatment, the copper particles were partially peeled from the substrate. Next, the resultant was dried in the same way as in Example 10. The resistances between the electrodes having gaps of 1 mm, 2 mm and 5 mm, respectively, in FIG. 4 were 130 kΩ, 1.9Ω, and 1.0Ω, respectively. Thus, slightly higher resistances were shown than in Example 10.

Comparative Example 7

A 5% by mass dispersion slurry of copper/copper oxide core shell particles (trial product, manufactured by Fukuda Metal Foil & Powder Co., Ltd.), produced in a solution by a laser ablation process, in γ-butyrolactone was painted onto a polyimide substrate (trade name: MCF-5000I) with a bar coater. The resultant was dried on a hot plate at 100° C. under a nitrogen gas flow for 10 minutes. The painting and the drying were repeated 3 times to form a substrate having a copper particle layer. The substrate was treated in the same way as in Example 10. As a result, the treatment advanced while only the copper particle layer was selectively discolored into copper color. The resultant was dried and the volume resistances were obtained in the same way as in Example 10. The resistances were $2.0 \times 10^{-5}$ Ωm, and $1.1 \times 10^{-5}$ Ωm, respectively. Thus, these were higher volume resistances than in Example 10.

Figure 11:
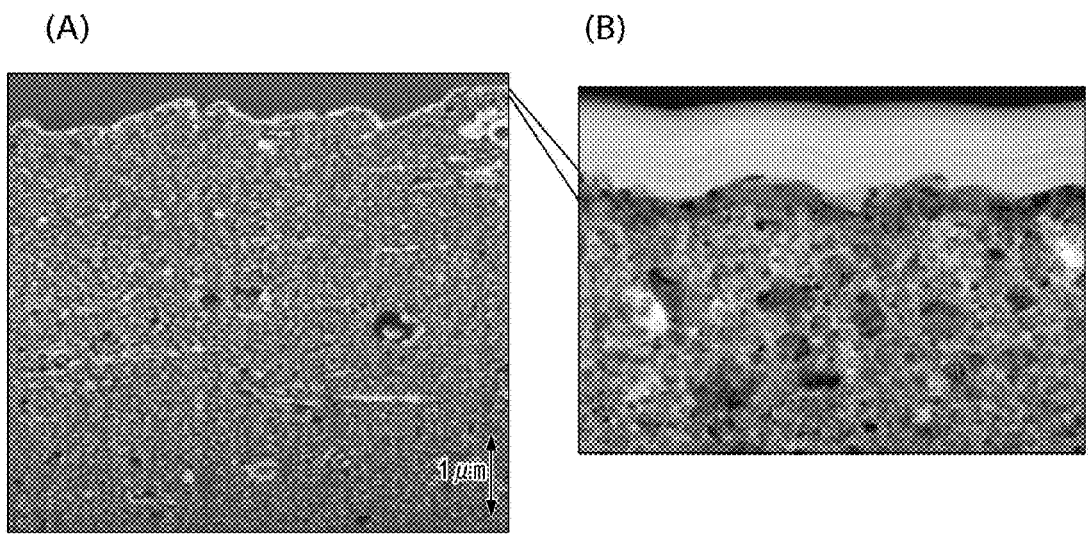
FIG. 11 are a drawing substituted photograph (A) showing an SIM image of an FIB-worked cross section of a copper particle layer in Comparative Example 7, and a drawing substituted photograph (B) showing a TEM image of the cross section.

As illustrated in FIG. 11, a structure in the form of a dense thin film was generated on the surface of the copper particle layer. Below the film-form structure, a structure made of the copper nanoparticles was seen.

Comparative Example 8

Copper/copper oxide core shell particles (manufactured by Nisshin Engineering Inc.; number-average particle diameter: 41 nm) and copper oxide nanoparticles (manufactured by C.I. Kasei Co., Ltd.; number-average particle diameter: 50 nm) were mixed at a ratio by weight of 1:9, and then mixture was added to γ-butyrolactone to give a concentration of 20% by weight. The resultant was treated with an ultrasonic washer to disperse the particles. In this way, a dispersion slurry was yielded. Painting this dispersion slurry onto an epoxy substrate (MCL-679FB, manufactured by Hitachi Chemical Co., Ltd.) having copper foil (F0WS, manufactured by Furukawa Electric Co., Ltd.) patterns illustrated in FIG. 4 with a bar coater. The painted film was dried on a hot plate at 100° C. under a nitrogen gas flow for 10 minutes to form a substrate having a copper particle layer. The substrate was treated and washed in the same way as in Example 10. In the present example, the precipitation of copper was observed in a region other than the copper particle layer. The resistances between the electrodes having gaps of 1 mm, 2 mm and 5 mm, respectively, in FIG. 4 were 0.2Ω, 0.4Ω, and 3.0Ω, respectively. Thus, slightly higher resistances were shown than in Example 10.

Comparative Example 9

A 20% by weight dispersion slurry of copper oxide nanoparticles (manufactured by C.I. Kasei Co., Ltd.; number-average: 50 nm) in γ-butyrolactone was painted onto a Pd-seeded epoxy substrate as in Example 10 with a bar coater. The resultant was dried on a hot plate at 100° C. under a nitrogen gas flow for 10 minutes to form a substrate having a copper oxide particle deposited film. The substrate was treated in the same way as in Example 10. As a result, a large amount of copper precipitated in a region other than the copper particle painted region during the treatment. Thereafter, the substrate was washed and dried in the same way as in Example 10. The resistances between the electrodes having gaps of 1 mm, 2 mm and 5 mm, respectively, in FIG. 4 were 0Ω, 0Ω, and 0.1Ω, respectively, which were not more than the measurement lower limit of the tester.

Results of the above-mentioned examples and comparative examples are shown in Table 3.

TABLE 3

|  | Example 10 | Comparative Example 6 | Comparative Example 7 | Comparative Example 8 | Comparative Example 9 |
| --- | --- | --- | --- | --- | --- |
| Substrate | Pd seeded substrate | Pd seeded substrate | Polyimide substrate | Epoxy substrate | Pd seeded substrate |
| Particles | Copper/copper oxide core shell particles | Copper/copper oxide core shell particles | Copper/copper oxide core shell particles | Copper/copper oxide core shell particles | — |
|  | Copper oxide particles | — | — | Copper oxide particles | Copper oxide particles |
| Treatment solution | Treatment solution A | Treatment solution A | Treatment solution A | Treatment solution A | Treatment solution A |
| Volume resistance (1-mm gap) | $2.3 \times 10^{-7}$ Ω·m | — | $2.0 \times 10^{-5}$ Ω·m | — | — |
| Volume resistance (5-mm gap) | $1.0 \times 10^{-6}$ Ω·m | — | $1.1 \times 10^{-5}$ Ω·m | — | — |
| Resistance values 1-mm gap | 0.019 Ω | 130 kΩ | 3.2 Ω | 0.2 Ω | 0 Ω |
| 2-mm gap | <0.1 Ω | 1.9 Ω | 0.9 Ω | 0.4 Ω | 0 Ω |
| 5-mm gap | 0.11 Ω | 1.0 Ω | 1.7 Ω | 3.0 Ω | 0.1 Ω |
| Precipitation of copper into a region other than the copper particle layer | Not observed | Not observed | Not observed | Observed | Observed |

According to Table 3, in Example 10, the resistance was low and further no copper precipitated in any region other than the copper conductor film. On the other hand, in Comparative Examples 6 to 9, the resistance was high, or copper precipitated in a region other than the copper conductor film although the resistance was low. From the results of Comparative Examples 6 to 9, satisfactory results were not obtained.

Example 11

Steps from the Formation of a Substrate to Oxidizing Treatment

Copper/copper oxide core shell particles (manufactured by Nisshin Engineering Inc.; number-average particle diameter: 41 nm) were incorporated into γ-butyrolactone to give a concentration of 20% by weight. The resultant was treated with an ultrasonic washer to disperse the particles. In this way, a dispersion slurry was yielded. This dispersion slurry was painted onto a polyimide substrate (MCL-5000I, manufactured by Hitachi Chemical Co., Ltd.) 10 having copper foil patterns (hatched regions) illustrated in FIG. 4 with a bar coater. Next, the painted film was dried on a hot plate at 100° C. under a nitrogen gas flow for 10 minutes to form a substrate having a copper particle painted film. The substrate was subjected to heating treatment on a hot plate 200° C. in temperature in the air for 10 minutes, to be subjected to oxidizing treatment. In this way, the surface of the painted film changed from dark brown to greenish black.

(Treatment with a Treatment Solution)

Figure 12:
FIG. 12 is a drawing substituted photograph showing an SIM image of an FIB-worked cross section of a copper particle layer in Example 11.

Next, the individual components described in column 1 in Table 1 were weighed, and mixed with each other to yield a treatment solution A. The substrate on which the painted film was formed was put onto the bottom of a laboratory dish. While a small piece of glass was put onto an end of the substrate to cause the substrate not to float, the treatment solution A was poured thereinto so as to conduct a treatment for 5 hours. By this treatment, the copper particle painted film was discolored into dull copper color. After the end of the treatment, the resultant was immersed into extra pure water to be washed therewith. Thereafter, the resultant was dried in the air. Next, about the electrodes having gaps of 1 mm and 5 mm, respectively, in FIG. 4, the resistances therebetween were each measured with a four-point probe microresistance meter (Loresta MCP-T610, manufactured by Mitsubishi Chemical Corp.). Using the film thickness obtained by FIB/SIM cross-section observation, which was 8.3 μm, the volume resistances were calculated. The resistances were $4.0 \times 10^{-7}$ Ωm, and $5.7 \times 10^{-7}$ Ωm, respectively. As shown in FIG. 12, according to the FIB/SIM cross-section observation, a structure of copper near the substrate grew to be coarse.

Example 12

The same treatment and washing as in Example 11 were conducted except that the substrate was subjected to heating treatment on a hot plate 200° C. in temperature in the air for 20 minutes. The resistances were measured with a tester. As a result, the resistances were each 0Ω, which was not more than the measurement lower limit. Thus, about the electrodes having gaps of 1 mm and 5 mm, respectively, the resistances therebetween were each measured with a four-point probe microresistance meter (Loresta MCP-T610, manufactured by Mitsubishi Chemical Corp.). The resistances were 0.129Ω and 0.060Ω, respectively.

Comparative Example 10

A copper nanoparticle painted substrate formed in the same way as in Example 11 was subjected to liquid phase treatment and washing without being subjected to heating treatment (oxidizing treatment) on any hot plate 200° C. in temperature in the air for 10 minutes. Next, about the electrodes having gaps of 1 mm and 5 mm, respectively, in FIG. 4, the resistances therebetween were measured with a four-point probe microresistance meter (Loresta MCP-T610, manufactured by Mitsubishi Chemical Corp.). The volume resistances were calculated using the film thickness obtained by FIB/SIM cross-section observation, which was 9.7 μm. As a result, the resistances were $4.2 \times 10^{-6}$ Ωm, and $1.3 \times 10^{-6}$ Ωm, respectively.

Figure 13:
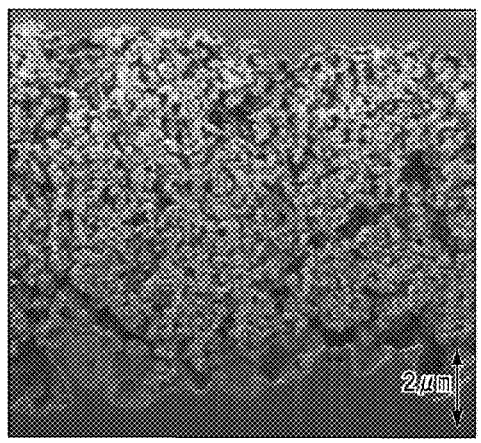
FIG. 13 is a drawing substituted photograph showing an SIM image of an FIB-worked cross section of a copper particle layer in Comparative Example 10.

As shown in FIG. 13, it was not observed that a structure of copper turned coarse near the substrate as illustrated in FIG. 12.

Comparative Example 11

The same treatment and washing as in Example 11 were conducted except that the substrate was subjected to heating treatment on a hot plate 200° C. in temperature in the air for 30 seconds. The resistances were measured with a tester. As a result, the resistances were 0.041Ω, and 0.061Ω, respectively.

Comparative Example 12

A 5% by mass dispersion slurry of copper/copper oxide core shell particles (trial product, manufactured by Fukuda Metal Foil & Powder Co., Ltd.), produced in a solution by a laser ablation process, in γ-butyrolactone was painted onto a polyimide substrate (trade name: MCF-5000I, manufactured by Hitachi Chemical Co., Ltd.) with a bar coater. The resultant was dried on a hot plate at 100° C. under a nitrogen gas flow for 10 minutes. The painting and the drying were repeated 3 times to form a substrate having a copper based particle painted film. The substrate was treated with the treatment solution A in the same way as in Example 11. The treatment advanced while only the copper particle painted region was selectively discolored into copper color. In the same way as in Example 11, the resultant was dried and then the volume resistances were obtained. The resistances were $2.0 \times 10^{-5}$ Ωm, and $1.1 \times 10^{-5}$ Ωm, respectively. Thus, these were higher volume resistances than in Example 11.

Figure 14:
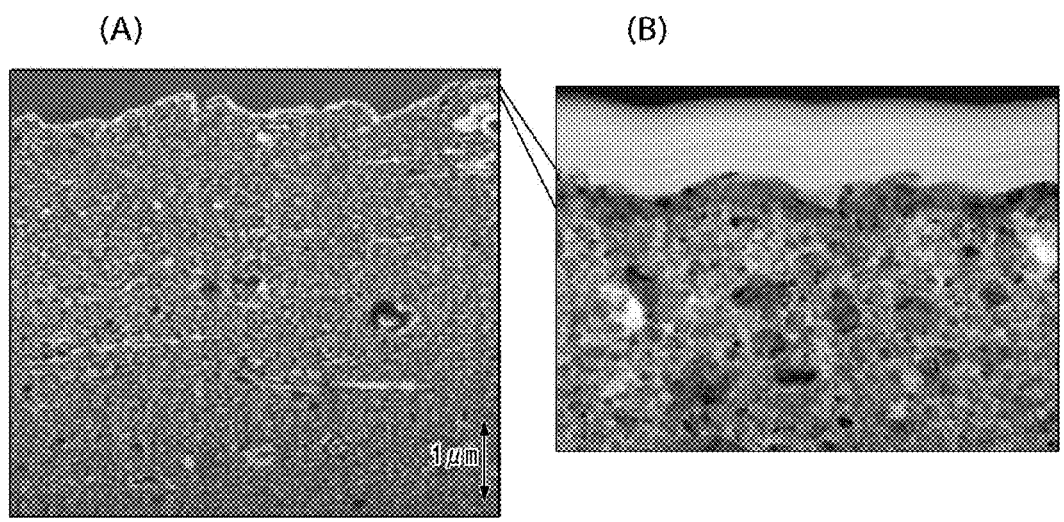
FIG. 14 are a drawing substituted photograph (A) showing an SIM image of an FIB-worked cross section of a copper particle layer in Comparative Example 12, and a drawing substituted photograph (B) showing a TEM image of the cross section.

As illustrated in FIG. 14, a structure in the form of a dense thin film was generated on the surface of the copper based particle layer. Below the film-form structure, a structure made of the copper nanoparticles was seen.

Results of Examples 11 to 12 and Comparative Examples 10 to 12 are shown in Table 4.

TABLE 4

|  | Example 11 | Example 12 | Comparative example 10 | Comparative example 11 | Comparative example 12 |
| --- | --- | --- | --- | --- | --- |
| Particles | Copper/ copper oxide core shell particles | Copper/ copper oxide core shell particles | Copper/ copper oxide core shell particles | Copper/ copper oxide core shell particles | Copper/ copper oxide core shell particles (based on laser ablation) |
| Oxidizing treatment | 200° C. for 10 minutes | 200° C. for 20 minutes | Not conducted | 200° C. for 30 seconds | Not conducted |
| Treatment solution | Treatment solution A | Treatment solution A | Treatment solution A | Treatment solution A | Treatment solution A |
| Resistances 1-mm gap | $4.0 \times 10^{-7}$ Ω·m | $8.0 \times 10^{-7}$ Ω·m | $4.2 \times 10^{-6}$ Ω·m | $4.6 \times 10^{-6}$ Ω·m | $2.0 \times 10^{-5}$ Ω·m |
| 5-mm gap | $5.7 \times 10^{-7}$ Ω·m | $4.0 \times 10^{-7}$ Ω·m | $1.3 \times 10^{-6}$ Ω·m | $7.2 \times 10^{-7}$ Ω·m | $1.1 \times 10^{-5}$ Ω·m |

It is understood from Table 4 that in each of Examples 11 and 12, a copper conductor film lower in resistance was obtained than in Comparative Examples 10 to 12. It is presumed that this is caused that a dense copper film was formed in the depths as well as in the outermost region in Examples.

The invention claimed is:

1. A manufacturing method of a conductive substrate, comprising:
the step of forming, on a substrate, a layer containing a metal having catalytic activity,
the step of forming, on the layer, a copper particle layer containing first type particles having a core/shell structure having a core region comprising copper and a shell region comprising copper oxide, and a second type particles comprising a copper oxide, and
the step of treating the copper particle layer with a treatment solution which contains a chemical agent for ionizing or complexing the copper oxide, and a reducing agent for reducing a copper ion or copper complex to be made into metallic copper,
wherein the chemical agent for ionizing or complexing the copper oxide [is at least one selected from the group consisting of basic nitrogen-containing compounds, salts of basic nitrogen-containing compounds, EDTA, bipyridyl, and β-diketones] comprises bipyridyl, EDTA, and at least one selected from the group consisting of ammonia water, ethylenediamine and butylamine, and
the reducing agent for reducing copper ion or copper complex comprises dimethylamineborane.

2. The manufacturing method of a conductive substrate according to claim 1, wherein about the first type particles (x) having the core/shell structure, and the second type particles (y) comprising the copper oxide, the ratio (x/y) by weight of the former to the latter is from 1/1 to 1/19.

3. The manufacturing method of a conductive substrate according to claim 1 or 2, wherein about the chemical agent (a) and the reducing agent (b) in the treatment solution, the mole ratio (a/b) of the former to the latter is less than 5000.

4. The manufacturing method of a conductive substrate according to claim 1 or 2, wherein the metal having catalytic activity is a transition metal in a metallic form or an alloy.

5. The manufacturing method of a conductive substrate according to claim 4, wherein at least one of the transition metal or the alloy is a metal selected from the group consisting of Cu, Pd, Ag, Ru, Rh, Ni, Pt and Au.

6. A manufacturing method of a conductive substrate, comprising
the step of painting, onto a substrate, a painting slurry which contains particles having a core/shell structure having a core region comprising copper and a shell region comprising a copper oxide, thereby forming a painted film,
the step of subjecting the formed painted film to oxidizing treatment to decrease the distribution of the copper oxide component gradually from the outermost region of the painted film toward the substrate, and
the step of treating the painted film subjected to the oxidizing treatment with a treatment solution which contains a chemical agent for ionizing or complexing the copper oxide, and a reducing agent for reducing a copper ion or copper complex to be made into metallic copper,
wherein the chemical agent for ionizing or complexing the copper oxide [is at least one selected from the group consisting of basic nitrogen-containing compounds, salts of basic nitrogen-containing compounds, EDTA, bipyridyl, and β-diketones] comprises bipyridyl, EDTA, and at least one selected from the group consisting of ammonia water, ethylenediamine and butylamine, and
the reducing agent for reducing copper ion or copper complex comprises dimethylamineborane.

7. The manufacturing method of a conductive substrate according to claim 6, wherein the oxidizing treatment is conducted by heating the painted film in the air.

* * * * *